US007848077B2

United States Patent
Mizuno et al.

(10) Patent No.: US 7,848,077 B2
(45) Date of Patent: Dec. 7, 2010

(54) ELECTROSTATIC CHUCK DEVICE

(75) Inventors: Shigeru Mizuno, Tokyo (JP); Masahito Ishihara, Fuchu (JP); Sunil Wickramanayaka, Tama (JP); Naoki Miyazaki, Hino (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/588,809

(22) Filed: Oct. 28, 2009

(65) Prior Publication Data

US 2010/0046134 A1   Feb. 25, 2010

Related U.S. Application Data

(63) Continuation of application No. 12/289,207, filed on Oct. 22, 2008, now Pat. No. 7,724,493, which is a continuation of application No. 10/462,765, filed on Jun. 17, 2003, now Pat. No. 7,623,334.

(30) Foreign Application Priority Data

| Jun. 18, 2002 | (JP) | ............................. 2002-177380 |
| Jun. 18, 2002 | (JP) | ............................. 2002-177381 |
| Oct. 24, 2002 | (JP) | ............................. 2002-309915 |

(51) Int. Cl.
*H01T 23/00* (2006.01)

(52) U.S. Cl. ........................................ 361/234; 361/230

(58) Field of Classification Search .......... 361/230–234
See application file for complete search history.

(56) References Cited

U.S. PATENT DOCUMENTS 4,551,192 A    11/1985   Di Milia et al.

(Continued)

FOREIGN PATENT DOCUMENTS

JP    A-05-160076    6/1993

(Continued)

OTHER PUBLICATIONS

J. Daviet et al., "Induced Electrical Phenomena," *J. Electrochem. Soc.*, vol. 140, No. 11, pp. 3251-3261, Nov. 1993.

(Continued)

*Primary Examiner*—Danny Nguyen
(74) *Attorney, Agent, or Firm*—Oliff & Berridge, PLC

(57) ABSTRACT

An electrostatic chuck device provided with a dielectric plate with a surface embossed to give it a plurality of projections, an electrode, and an external power source, wherein substrate supporting surfaces of the plurality of projections are covered by conductor wiring and the conductor wiring electrically connects the substrate supporting surfaces of the plurality of projections. At the time of substrate processing, when the embossed projections contact the back of the substrate, the back of the substrate and the conductor wiring is made the same in potential due to the migration of the charges, the generation of force between the back of the substrate and the conductor wiring being in contact with the same is prevented, and a rubbing state between the two is prevented. Due to this, the electrostatic chuck device reduces the generation of particles, easily and stably removes and conveys substrates, and realizes a high yield and system operating rate.

3 Claims, 21 Drawing Sheets

U.S. PATENT DOCUMENTS

| | | | |
|---|---|---|---|
| 4,692,836 A | 9/1987 | Suzuki | |
| 5,460,684 A | 10/1995 | Saeki et al. | |
| 5,527,215 A | 6/1996 | Rubino et al. | |
| 5,530,616 A | 6/1996 | Kitabayashi et al. | |
| 5,548,470 A | 8/1996 | Husain et al. | |
| 5,753,132 A | 5/1998 | Shamouilian et al. | |
| 5,777,838 A | 7/1998 | Tamagawa et al. | |
| 5,781,400 A | 7/1998 | Takahashi et al. | |
| 5,886,863 A | 3/1999 | Nagasaki et al. | |
| 5,903,428 A | 5/1999 | Grimard et al. | |
| 6,268,994 B1 | 7/2001 | Logan et al. | |
| 6,373,681 B2 | 4/2002 | Kanno et al. | |
| 6,475,606 B2 * | 11/2002 | Niwa | 428/210 |
| 6,556,414 B2 | 4/2003 | Kosakai | |
| 6,632,512 B1 | 10/2003 | Ito | |
| 6,781,812 B2 | 8/2004 | Fuma et al. | |
| 7,071,551 B2 | 7/2006 | Hiramatsu et al. | |
| 7,092,231 B2 | 8/2006 | Hoeks et al. | |
| 2002/0135967 A1 | 9/2002 | Fuwa et al. | |

FOREIGN PATENT DOCUMENTS

| | | |
|---|---|---|
| JP | 08-046019 A | 2/1996 |
| JP | A-09-082788 | 3/1997 |
| JP | 09-134951 A | 5/1997 |
| JP | 09-213777 A | 8/1997 |
| JP | A 09-327188 | 12/1997 |
| JP | A 10-098092 | 4/1998 |
| JP | A 10-107132 | 4/1998 |
| JP | 10-150100 A | 6/1998 |
| JP | 10-223621 A | 8/1998 |
| JP | 11-251416 A | 9/1999 |
| JP | 2000-021962 A | 1/2000 |
| JP | A 2000-106392 | 4/2000 |
| JP | A 2000-183146 | 6/2000 |
| JP | 2000-317761 A | 11/2000 |
| JP | 2000-332091 A | 11/2000 |
| JP | 2001-007189 A | 1/2001 |
| JP | A-2001-118916 | 4/2001 |
| JP | A-2001-244319 | 9/2001 |
| JP | A 2001-308166 | 11/2001 |
| JP | A-2002-9138 | 1/2002 |
| JP | 2002-076105 A | 3/2002 |
| WO | WO 99/16122 | 4/1999 |

OTHER PUBLICATIONS

J. Daviet et al., "Electrostatic Clamping Applied to Semiconductor Plasma Processing," *J. Electrochem. Soc.*, vol. 140, No. 11, pp. 3245-3250, Nov. 1993.

* cited by examiner

ELECTROSTATIC CHUCK DEVICE

This is a Continuation of application Ser. No. 12/289,207, filed Oct. 22, 2008, pending, which in turn is a Continuation of application Ser. No. 10/462,765 filed Jun. 17, 2003. The disclosure of the prior applications is hereby incorporated by reference herein in their entirety.

BACKGROUND

1. Field of the Invention

The present invention relates to an electrostatic chuck device, more particularly to an electrostatic chuck device for chucking and fixing a substrate in a substrate processing chamber in a semiconductor production process.

2. Description of the Related Art

In recent years, in processing substrates or wafers such as the formation or deposition of a thin film on a substrate (sputtering, chemical vapor deposition (CVD), etc.) or dry etching in a semiconductor production process, electrostatic chuck devices are frequently used for fixing the substrates or wafers onto a wafer holder. In comparison with the conventional mechanical clamping units, when fixing a substrate, an electrostatic chuck mechanism does not have any parts for touching and holding the upper surface of the substrate. Accordingly, a percentage of devices obtained from one substrate becomes high and a yield rate of the devices can be raised. Further, precise control of the temperature through a combination with a temperature regulator becomes possible.

Electrostatic chuck (ESC) devices are divided into two types. One is a unipolar type and another is a bipolar type. Operation of a unipolar device requires plasma over the entire surface of the substrate. This plasma creates the electrical connection required for generating an electrostatic force. A bipolar device, however, operates even without plasma. Therefore, generally, the electrostatic chuck devices can be used for both plasma process and non-plasma process.

An example of a conventional electrostatic chuck device will be explained with reference to FIG. 23. This electrostatic chuck device is applied to a sputtering system, for example. In this sputtering system, the pressure inside of a metal vessel 11 is reduced in pressure by an evacuation mechanism (not shown). A disk-shaped target 13 supported by a ring-shaped insulating member 12 is attached to the ceiling part of the vessel 11. In the outside of the vessel 11, magnets 15 fixed to a yoke 14 are placed at the back of the target 13. At the lower section of the inside of the vessel 11, a substrate support 16 is provided. A substrate 17 is loaded on the top surface of the substrate support 16. The substrate 17 is arranged to face the target 13 in parallel to it. The substrate support 16 is fixed to the bottom of the vessel 11. The substrate support 16 is provided with an electrostatic chuck device 18 and a substrate temperature regulator 19. A cylindrical shield 20 is provided near the inside surface of the surrounding walls of the vessel 11.

The electrostatic chuck device 18 is comprised of a dielectric plate 22 on the surface of which an embossed part 21 is formed by an embossing process, and a metal electrode 23 arranged at the inside of the dielectric plate 22. The height of the embossed part is 5 to 25 μm. The metal electrode 23 has, for example, a bipolar electrode structure comprised of an inside electrode 23a and outside electrode 23b. The metal electrode 23 is connected to an external DC power circuit 24 and supplied with a certain voltage. The external DC power circuit 24 includes a battery 24a for supplying a plus voltage, a battery 24b for supplying a minus voltage, a ground terminal 24c, and switches 24d and 24e. The inside electrode 23a is supplied with a plus voltage by the battery 24a, while the outside battery 23b is supplied with a minus voltage by the battery 23b, for example. The substrate (silicon substrate) 17 is fixed on the substrate support 16 by the coulomb force (electrostatic force) acting between the metal electrode 23 and the substrate 17 when it is placed on the dielectric plate 22 and a predetermined voltage is supplied to the metal electrode 23. The coulomb force is generated by the charges induced at the surface of the dielectric plate 22. The substrate 17 is clamped on the surface of the dielectric plate 22 by the coulomb force.

The substrate temperature regulator 19 is provided below the electrostatic chuck device 18. The substrate temperature regulator 19 is comprised of a thermocouple 25, a power source/control mechanism 26, and a heating/cooling unit 27. The cooling/heating unit 27 is controlled to a required predetermined temperature by the thermocouple 25 and power source/control mechanism 26 and holds the dielectric plate 22 provided on it at a predetermined temperature. The temperature of the substrate 17 on the embossed part 21 of the dielectric plate 22 is held at a predetermined temperature by heat conduction of a gas introduced into the clearances 21a formed by the embossed part 21 by a gas supply source 28 and gas introduction path 29, and the clearances 21a are held at a predetermined pressure.

When the substrate 17 is clamped by the electrostatic chuck device 18, the clamping force has to be sufficiently larger than the force due to the differential pressure between the pressure in the clearances 21a and the internal pressure of the vessel 11. The normal sputtering pressure is several millitorrs (mTorr). Therefore, the value of the differential pressure is substantially equal to the pressure of the clearances 21a. In this case, the value of the differential pressure is about 10 Torr.

The force clamping the substrate 17 is the coulomb force acting between the surface of the dielectric plate 22 and the substrate 17. The coulomb force will be explained with reference to FIG. 24 and FIG. 25.

The substrate 17 is placed on the embossed part 21 of the dielectric plate 22. As shown in FIG. 24, when a plus voltage is supplied to the metal electrode 23 (inside electrode 23a) from the battery 24, plus charges are induced on the surface of the dielectric plate 22, and simultaneously minus charges are induced on the back of the substrate 17.

When the unipolar electrode is used as the metal electrode, the substrate 17 is electrically connected to the ground for the power source through the plasma and a closed circuit is formed. When the bipolar electrode is used as the metal electrode, charges appear at the back of the dielectric plate 22 corresponding to each of plus and minus voltages of the internal and external electrodes. A closed circuit is formed through the back surface of the substrate 17, and the charges are induced on the back surface of the substrate 17. Due to the formation of the closed-circuit for a DC current via the back surface of the substrate, the substrate gets electrostatically chucked without a plasma.

The force (F) acting between the surface of the dielectric plate 22 and the substrate 17 satisfies $F = \in (V^2/L^2)A/2$ in the case of the unipolar electrode, while it satisfies $F = \in (V^2/L^2)A/8$ in the case of the bipolar electrode with the same plus and minus electrode areas. Here, $\in$ is the dielectric constant of the clearances 21a, V is the voltage, L is the distance between the dielectric plate and the back of the substrate (back of silicon substrate), and A is the electrode area. The clamping force is proportional to the supplied voltage and electrode area and is inversely proportional to the distance between the substrate and the dielectric plate. In sputtering, it is necessary to heat the substrate before film formation and to hold it at a predetermined temperature, so usually the bipolar electrode is used.

On the other hand, at projections 21b of the embossed part 21 where the substrate 17 and the dielectric plate 22 come into direct contact, as shown in FIG. 25, fine clearances 30 (distance δ of clearances) are generated due to the fine projections and recesses on the surface of the substrate 17 or dielectric plate 22. The distance δ of the clearances 30 is extremely small or about 0.1 μm, so the force generated across the clearances 30 becomes extremely large. This is called the "Johnsen-Rahbek effect" ("JR effect").

The clamping force will be calculated for the case of the bipolar electrode. When processing a substrate whose diameter is 300 mm, it is assumed that the diameter of the dielectric plate 22 is 300 mm, and the outer periphery with 1 mm of the dielectric plate 22 and the embossed projections contact the substrate and support it. The surface area of the contact sections becomes 1% of the horizontal area of the entire dielectric plate. As the metal electrode 23, a bipolar electrode split into two to form an inside circle and an outside ring is used. The metal electrode 23, for calculation purposes, is assumed to be a disk with a diameter of 298 mm. The voltage supplied to the metal electrode is made +200 V for the plus electrode and −200 V for the minus electrode. The emboss gap (difference in height between the projections and recesses) corresponding to the distance L between the substrate 17 and the dielectric plate 22 is 7 μm, while the fine clearance δ of the contact parts between the embossed projections 21b and the substrate is 0.1 μm, for example. Further, the clamping force is assumed to act on the surface of the dielectric plate in only the vertical direction.

The force acting on the depressions of the embossed part 21 becomes 500 N to 600 N and the force acting on the projections 21b becomes 5000 N to 10000 N. Therefore, the whole force on the embossed part 21 becomes 5500 N to 10600 N. The force acting on the projections 21b is extremely large and important in control. The total of these forces acts on the substrate as a whole, but the force per unit area, or the pressure, becomes 500 Torr to 1000 Torr. This pressure is sufficiently larger than the force due to the differential pressure between the pressure of the clearances between the substrate 17 and the dielectric plate 22 and the internal pressure of the vessel 11, so the substrate 17 is stably clamped and fixed on the dielectric plate 22.

Next, the sputtering process for the substrate 17 in the vessel 11 of the sputtering system will be explained.

The substrate 17 is carried into the vessel 11 and placed on the dielectric plate 22 of the substrate support 16. The substrate 17 is conveyed by a not shown conveyance robot and lift pins. Next, the external DC power circuit 24 is operated and predetermined voltages are supplied to the electrode 23. In this example, +200 V is supplied to the internal electrode 23a, while −200 V is supplied to the external electrode 23b. The internal electrode 23a and the external electrode 23b are supplied with the same voltages in absolute value. When the electrode 23 is supplied with voltages, as explained above, the electrostatic force clamps and fixes the substrate 17 to the dielectric plate 22. When the substrate 17 is fixed, a gas is introduced to the clearances 21a formed between the substrate 17 and the dielectric plate 22 from a gas supply source 28 through a gas introduction path 29. The pressure within the clearances 21a is controlled to a certain predetermined pressure in the range of 1 Torr to 10 Torr. Due to this gas, heat is conducted from the dielectric plate 22 held at a predetermined temperature by the substrate temperature regulator 19 to the substrate 17. As a result, the substrate 17 also rises in temperature and is held at a predetermined temperature. When the substrate temperature reaches a certain level, Ar gas is introduced into the vessel 11 and the pressure within the vessel 11 is held at a predetermined pressure. Next, the target 13 facing the substrate 17 is supplied with a high voltage from a sputter power source 31, electric discharge occurs within the vessel 11, and a desired thin film is formed on the substrate 17 by the sputtering action on the target 13. After the formation of the film ends, the introduction of gas into the inside of the vessel and the supply of gas into the clearances 21a are stopped. After the pressure sufficiently falls, the supply of voltage to the electrode 23 is stopped. Next, not shown lift pins are used to separate the substrate 17 from the embossed part 21 of the dielectric plate 22 and a conveyance robot which is similarly not shown is used to convey the substrate 17 out of the vessel 11.

According to the above configuration of the conventional electrostatic chuck device, two important problems of the generation of particles and declamping of the substrate explained below arise.

Problem of generation of particles: The conventional electrostatic chuck device is set so that the clamping force between the substrate 17 and the embossed part 21 of the dielectric plate 22 becomes strong. Therefore, as problems, it has arisen that at the time of start of clamping, the back of the substrate 17 rubs against the dielectric plate 22 and the substrate 17 is abraded, and accordingly large amounts of particles are generated and become sources of dust causing a drop in yield.

As shown in FIG. 25, the substrate 17 and the top surfaces of the projections 21b of the embossed part 21 at the dielectric plate 22 come into contact at several points. These contact points form clearances 30 between the substrate 17 and the projections 21b. The clearance 30 is in a vacuum state or filled with an inert gas. Therefore, in calculating the electrostatic force, a large clamping force is generated by the distance of "δ" shown in FIG. 25. This means that the substrate is basically fixed on the electrostatic chuck device 18 by the force generated on the embossed part. That is, at the back of the substrate 17, an extremely large pressure is present on a smaller surface area. As a result, the substrate 17 and the dielectric plate 22 are abraded by friction and fine particles are generated. Part of these particles directly sticks on the back of the substrate, while the remainder falls into the depressions (or clearances 21a) of the embossed part 21 and is deposited there. With repeated processing of a substrate 17, the number of particles deposited in the depressions increases and the particles start to stick on the back of the substrate. The particles stick on the back of the substrate for two reasons. The first reason is the electrostatic force generated between the substrate and the particles. The second reason is that the particles start floating freely due to the rapid flow of the inert gas through the clearances 21a between the substrate and the dielectric plate. These free-floating particles can stick on the back of the substrate.

To solve the problem of the generation of particles, it is sufficient to reduce the area of the parts of the projections 21b contacting the substrate. Since these parts have the function of supporting the flexing substrate, however, there are limits to the reduction of the area.

Problem of declamping of substrate: The charge given at the surface of the dielectric plate 22 remains even after stopping the supply of voltage to the metal electrode 23 after processing the substrate 17, so the clamping force does not immediately dissipate.

The problem of declamping will be explained considering the above-mentioned hardware configuration and formula for obtaining the electrostatic force. To declamp the substrate, the electrodes 23a and 23b of the metal electrode 23 are disconnected from the batteries 24a and 24b and connected to the ground by operating the switches 24d and 24e.

When a DC voltage is given to the electrodes 23a and 23b, first charges build up on the electrodes 23a and 23b. These charges migrate slowly toward the dielectric plate 22, that is, the top surface of the embossed part 21, due to the presence of the strong electric field ($E_1$: shown in FIG. 24) generated between the substrate 17 and the electrodes 23a and 23b. The migration of the charges to the top surface of the embossed part 21 is due to the fact that the dielectric plate 22 normally is not a perfect insulator. Further, the dielectric plate 22 is deliberately doped with an impurity to reduce the electrical resistance. Finally, the charges accumulated on the top surface of the dielectric plate 22 or the top surface of the embossed part 21.

On the microscopic scale, the lower surface of the substrate 17 and the top surfaces of the projections 21b of the embossed part 21 are rough. Actual contact between the substrate and the dielectric plate 22 occurs only at a few locations as shown by FIG. 25. Due to the accumulation of charges on the top surface of the dielectric plate 22 (the top surface of the embossed part 21), the above electrical field ($E_1$) is reduced. Instead, the electrical field between the top surfaces of the projections 21b of the embossed part 21 and the substrate 17 becomes stronger. The charges generated on the top surface of the dielectric plate 22 fall along with the elapse of time. Therefore, even if no problem arises with respect to fixing the substrate by the electrostatic force, a problem arises in the operation to release the substrate which has been clamped. The reason is that when the electrodes 23a and 23b are connected to the ground to release the substrate, the charges on the top surface of the dielectric plate 22 will not immediately flow back to the electrodes 23a and 23b. Re-flow of the charges of the electrodes 23a and 23b depends on the electrical resistance of the dielectric plate 22. To facilitate the re-flow of the charges to the metal electrodes 23a and 23b, the dielectric plate 22 is doped with an impurity so as to reduce its electrical resistance. However, due to the re-flow of charges to the metal electrode, the electrical field in the dielectric plate 22 is weakened and therefore the re-flow of the charges gradually slows along with the elapse of time. In this way, the complete neutralization of the dielectric plate 22 by the charge re-flow process requires considerable time. Accordingly, swift release of the substrate cannot be readily achieved.

Therefore, if trying to separate the substrate 17 from the dielectric plate 22 by lift pins for the purpose of conveying the substrate 17 outside of the vessel 11, the substrate will generate a vibration and a deviation in position. As a result, the problems of deterioration of distribution of the charges and inability of conveyance etc. will occur in the later substrate processing, and further the problems of a drop in yield or a drop in system operating rate will be caused.

As a prior art related to the above problems, the electrostatic chuck device disclosed in Japanese Unexamined Patent Publication (Kokai) No. 11-251416 may be further mentioned. With this electrostatic chuck device, a good releasability of the clamped object is realized.

As further related art, U.S. Pat. No. 5,530,616 and J. Daviet, L. Peccoud, *J. Electrochem. Soc.*, Electrochemical Association, November, 1993, vol. 140, No. 11, pp. 3251-3256 may be mentioned.

SUMMARY

An object of the present invention is to provide an electrostatic chuck device reducing the generation of particles, easily and stably removing and conveying substrates, and realizing a high yield and system operating rate.

The electrostatic chuck device according to the present invention is configured as follows to achieve the above object.

According to a first aspect of the present invention, there is provided an electrostatic chuck device provided with a dielectric plate having a surface embossed to be provided with a plurality of projections, an electrode, and an external power source, wherein substrate supporting surfaces of the plurality of projections are covered by conductor wiring and the conductor wiring electrically connect the substrate supporting surfaces of the plurality of projections.

The above electrostatic chuck device is configured to clamp a substrate by the coulomb force acting between the surface of the dielectric plate and the back of the substrate. In this configuration, all of the top surfaces of the plurality of embossed projections contacting the back of the substrate to support the substrate are covered by the conductor wiring, and the conductor wiring electrically connects the plurality of embossed projections. Therefore, when the embossed projections contact with the back of the substrate in substrate processes, the back of the substrate and the conductor wiring come to be same potential due to the migration of the charges, the generation of force between the back of the substrate and the conductor wiring is prevented, and a rubbing state between the two is prevented.

Preferably, the electrostatic chuck device is further provided with a switch for switching the conductor wiring to be in a grounded state or in a floating state. When processing a substrate, the conductor wiring is held in the floating state by the switch to cause the above-mentioned action. when the processes of treating the substrate are completed, the switch is used to place the conductor wiring in the grounded state, whereby the charges generated at the embossed projections, the back of the substrate, and the surface of the dielectric plate are released and the clamping force is made to quickly dissipate.

Alternatively, the electrostatic chuck device is further provided with a conductor shaft at the center of the dielectric plate, through which the conductor wiring is connect to the switch.

More preferably, the material of the conductor wiring is an abrasion resistant metal or its alloy. It is possible to suppress the generation of particles by using the abrasion resistant metal for the conductor wiring.

Alternatively, more preferably, parts of the electrode, which are corresponding to the plurality of projections and near them, are removed. By removing these parts of the electrode, the amounts of charges at the top surfaces of the projections can be reduced and the coulomb force between the embossed projections and the substrate can be reduced.

According to a second aspect of the present invention, an electrostatic chuck device is provided with a dielectric plate with an embossed surface, an electrode layer formed in the embossed depressions, an external power source for placing the electrode layer in one of a state supplied with voltage and a grounded state, and conductor layers formed on substrate supporting surfaces of the embossed projections.

The above electrostatic chuck device may be used for substrate processing systems such as a sputtering system. The substrate fixed by the electrostatic chuck device is a silicon substrate etc. The surface of the dielectric plate is formed with embossed part by embossment processing. The embossed part is formed to have projections, depressions, and an outer peripheral projection. When the electrode layer formed at the embossed depressions is supplied with voltage, a charge is induced at the back of the substrate. The sections being in contact with the substrate are the conductor layers formed on the surfaces of the embossed projections, so the contact parts become the same potential as the substrate and no electrostatic force is generated. Therefore, it becomes possible to suppress the generation of particles due to rubbing. Note that the conductor layer is similarly formed at the surface of the outer peripheral projection as well. The embossed projections are defined as including the outer peripheral projection in concept. Further, if the electrode layer is grounded after the processing of the substrate, the induced charges can be rapidly released.

Preferably, a step difference formed between the electrode layer and the conductor layers is in a range of several μm to several tens of μm, particularly preferably a range of 5 μm to 30 μm.

Alternatively, the electrode layer is divided in the same plane and the resultant plurality of electrode layer sections are insulated from each other. With this configuration, a bipolar electrode layer comprised of an inside electrode layer and an outside electrode layer is formed.

Alternatively, the range where the conductor layers are formed is inside from the range of the surfaces of the embossed projections. With this configuration, the edges of the conductor layer and the edges of the electrode layer are prevented from being arranged linearly in the height direction.

Alternatively, the range where the conductor layers are formed is inside from the range of the surfaces of the embossed projections and the electrode layer is not formed around the embossed projections. With this configuration as well, the edges of the conductor layers and the edges of the electrode layer are prevented from being arranged linearly in the height direction.

More preferably, the materials of the electrode layer and the conductor layers are tungsten, molybdenum, tantalum, or a carbon-based conductor.

According to a third aspect of the present invention, a unipolar type electrostatic chuck device used for fixing a substrate, is comprised of a metal electrode having a plurality of embossed projections on its top surface, dielectric layers formed on the surfaces of the plurality of embossed projections, an insulator covering the metal electrode except for the top surface of the metal electrode, and a DC power source connected to the metal electrode.

According to a fourth aspect of the present invention, a bipolar type electrostatic chuck device used for fixing a substrate, is comprised of two metal electrodes having pluralities of embossed projections on their top surfaces and electrically insulated from each other, dielectric layers formed on the surfaces of the pluralities of embossed projections, an insulator covering the metal electrodes except for the top surfaces of the metal electrodes, and two DC power sources connected to the two metal electrodes in a separated state.

The electrostatic chuck devices of the third aspect and fourth aspect of the present invention may be further configured as follows. The dielectric layers may be made to cover the entire top surface or surfaces of the metal electrode or electrodes provided with the embossed projections. The height of the embossed projections may be made larger than 10 μm and the thickness of the dielectric layers smaller than 1 μm. The metal electrode or electrodes may have a mechanism for cooling or heating for maintaining desired temperatures on the metal electrode or electrodes. Further, in the present invention, the metal electrode or the two metal electrodes may be supplied with an rf current of a frequency in a range of 100 kHz to 100 MHz. The two metal electrodes may be connected to a single rf power source operating at a frequency in a range of 100 kHz to 100 MHz.

As explained above, the electrostatic chuck device for fixing the substrate on the electrode is characterized by providing embossed projections on a metal electrode considerably taller than the conventional device and by forming dielectric thin films much thinner than the conventional device on the top surfaces of the embossed projections. This configuration reduces the occurrence of particles, reduces the sticking of particles on the back of the substrate, and facilitates the process of releasing the substrate.

BRIEF DESCRIPTION OF THE DRAWINGS

These and other objects and features of the present invention will become clearer from the following description of the preferred embodiments given with reference to the attached drawings, wherein.

DETAILED DESCRIPTION OF EMBODIMENTS

Preferred embodiments of the present invention will be described in detail below in referring to the attached figures. The configurations, shapes, sizes, and relative arrangements explained in the following embodiments are only explained roughly to an extent enabling the present invention to be understood and worked. Further, the numerical values and compositions (materials) of the components are indicated as only illustrations. Therefore, the present invention is not limited to the embodiments explained below and can be modified in various ways to an extent not deviating from the scope of the technical ideas expressed in the claims.

A first embodiment of the electrostatic chuck device according to the present invention will be explained with reference to FIG. 1 to FIG. 6. In this embodiment, the explanation will be given for the example of an electrostatic chuck device applied to a sputtering system as the substrate film forming system.

Figure 1:
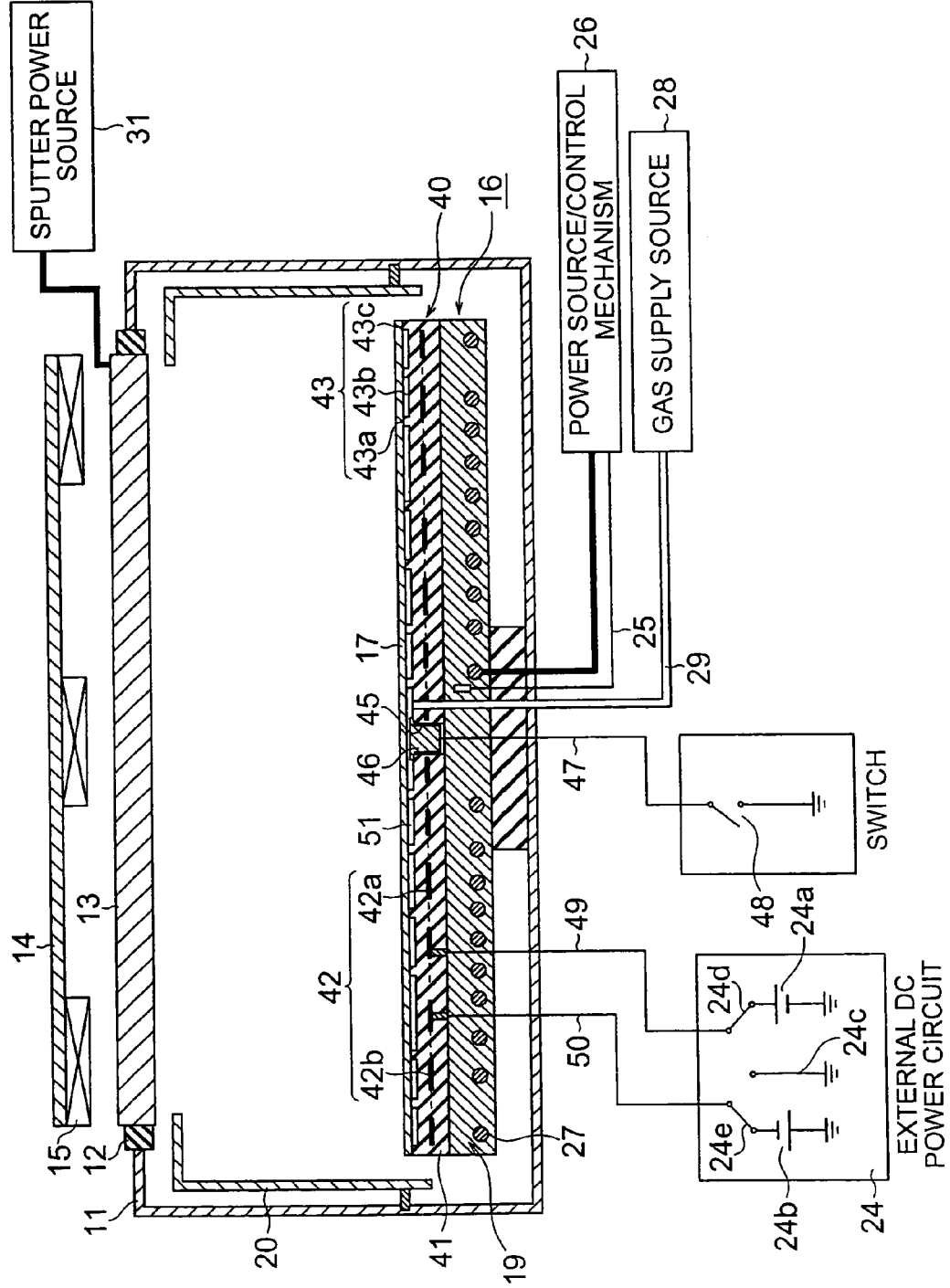
FIG. 1 is a longitudinal sectional view of a sputtering system to which an electrostatic chuck device according to a first embodiment of the present invention is applied.
Figure 23:
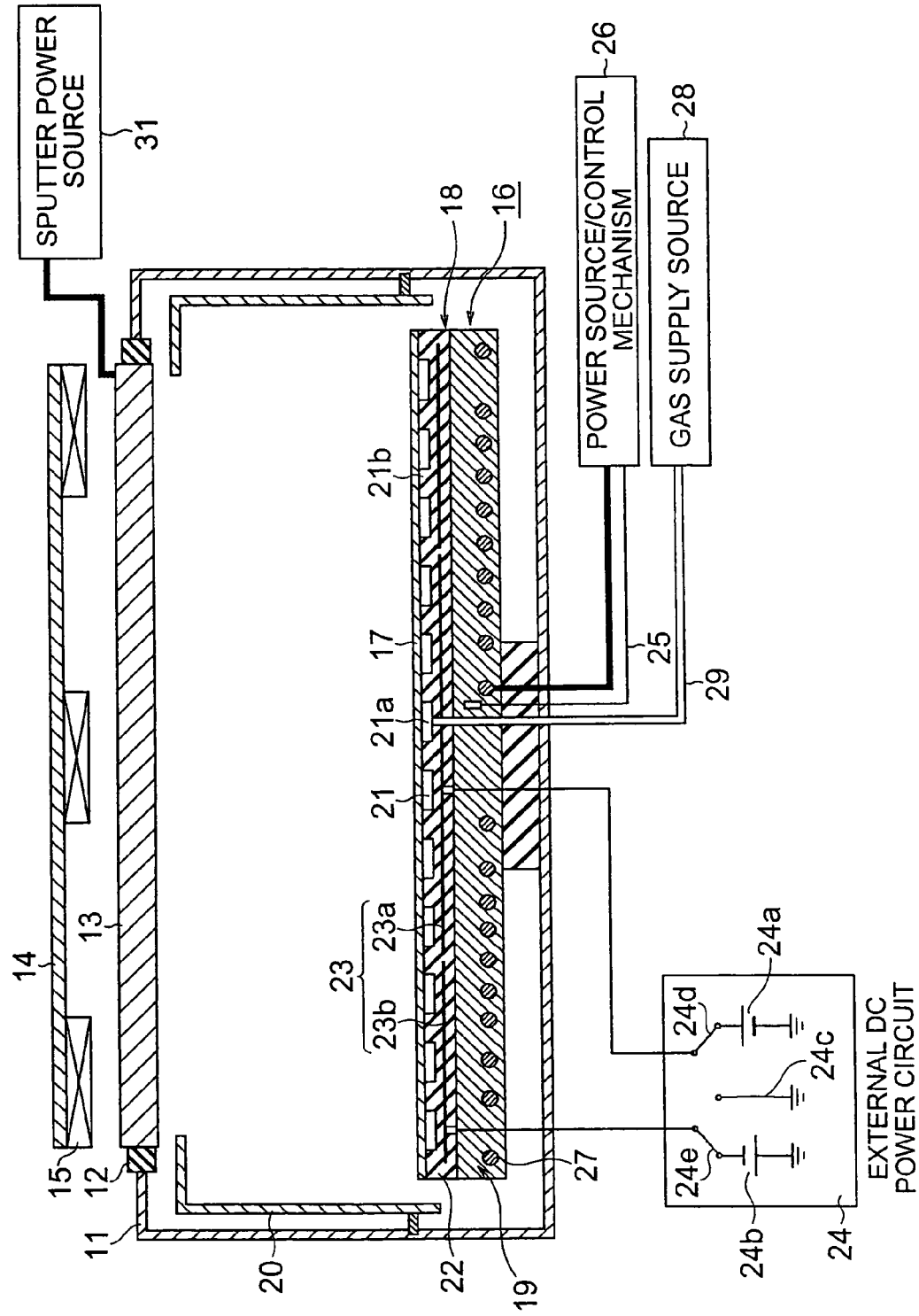
FIG. 23 is a longitudinal sectional view of a sputtering system provided with a conventional electrostatic chuck device.
Figure 24:
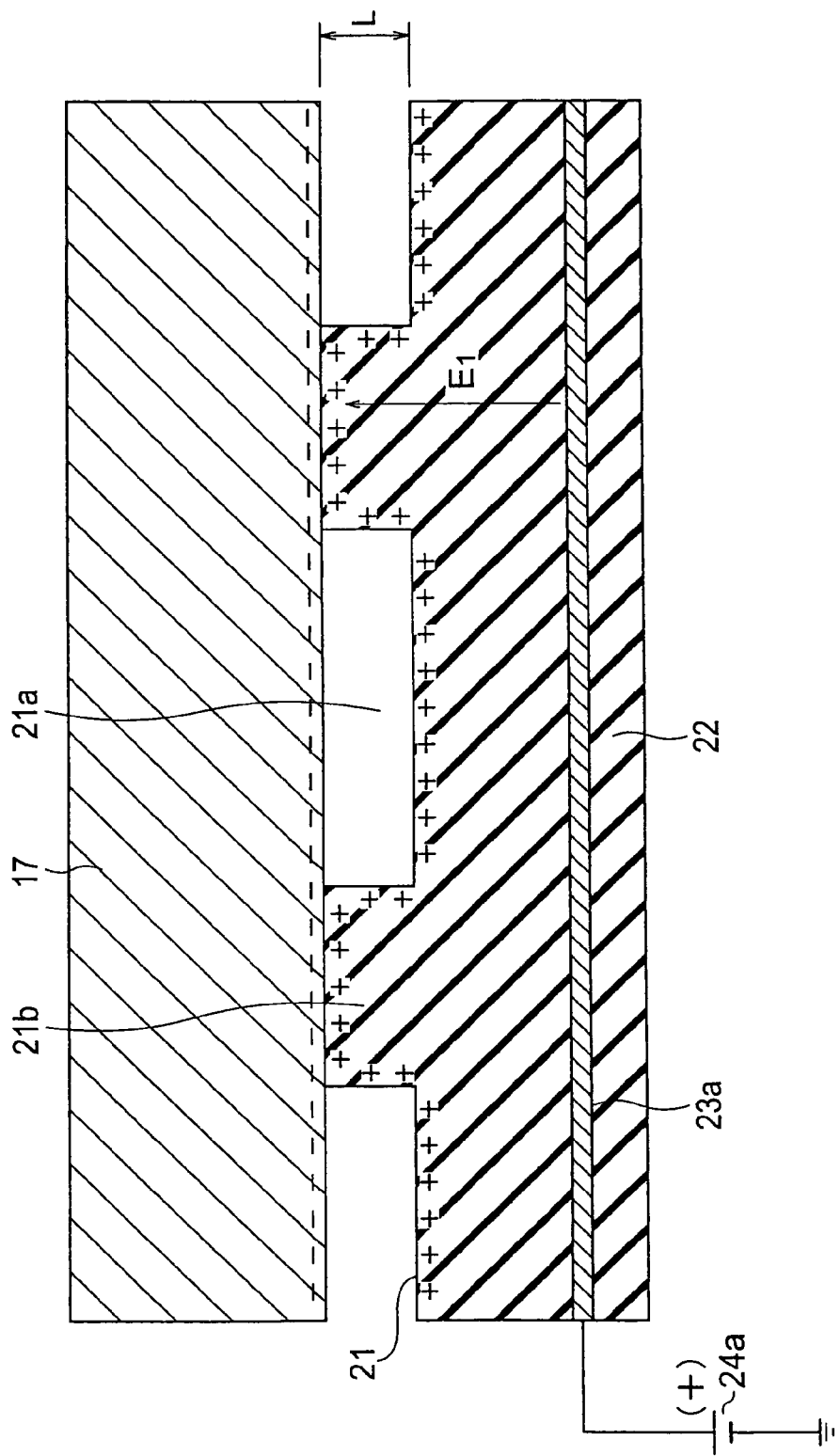
FIG. 24 is a partial enlarged longitudinal sectional view for explaining the contact relationship between an embossed part of a dielectric plate and a substrate in the conventional electrostatic chuck device.
Figure 25:
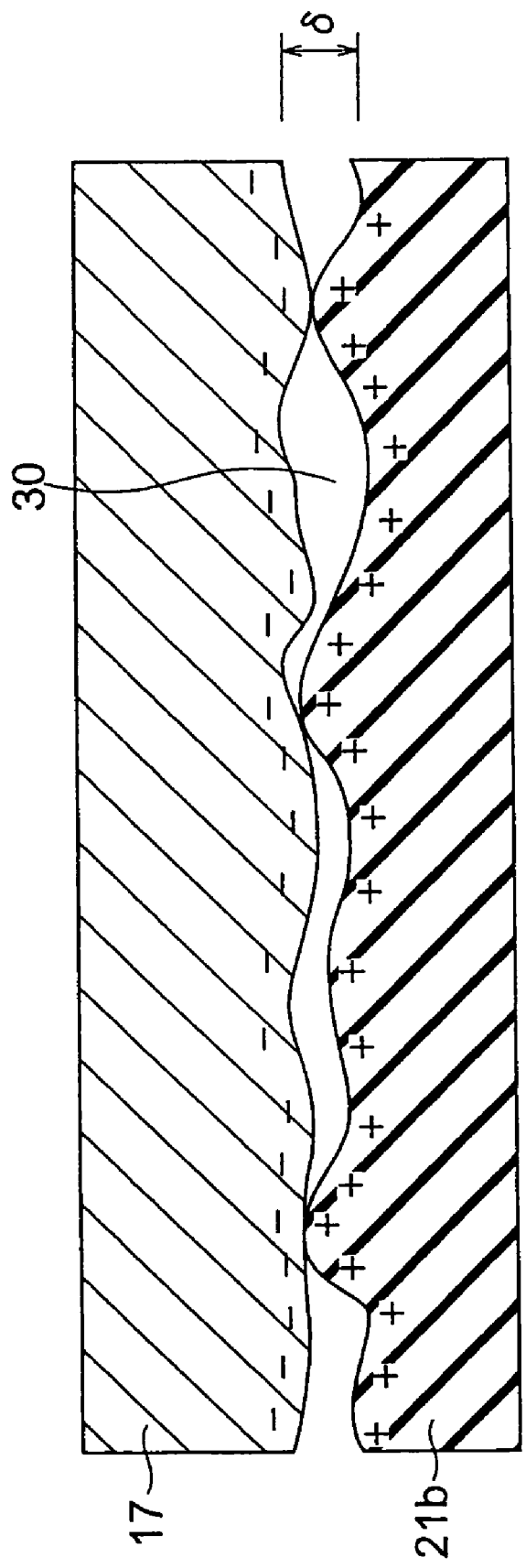
FIG. 25 is a partial enlarged longitudinal sectional view for explaining the contact relationship between the embossed projections and the substrate in the conventional electrostatic chuck device.

FIG. 1 shows the configuration of a sputtering system in which the electrostatic chuck device according to the first embodiment may be used. The basic parts of the configuration of this sputtering system are the same as in the conventional system explained with reference to FIG. 23. In FIG. 1, components the same as those explained in FIG. 23 are assigned the same reference numerals. Therefore, the configuration of the sputtering system will be only briefly explained. This sputtering system is comprised of a vessel 11 with an inside reduced in pressure by an external evacuation mechanism (not shown), a target attached to the ceiling of the vessel 11 through a ring-shaped insulating member 12, a magnet 15 placed at a back side of the target 13 and fixed to a yoke plate 14, a substrate support 16 placed at a position facing the target 13 and fixed to the bottom of the vessel 11, and an electrostatic chuck device 40, and a substrate temperature regulator 19 provided at the substrate support 16. The target 13 is supplied with voltage from a sputter power source 31. A cylindrical shield member 20 is arranged along the inside surface of the circumferential wall of the vessel 11.

In FIG. 1, illustrations of the substrate conveyance robot, loading/unloading gates, lift pins for carrying and detaching the substrate 17 at the substrate support 16, mechanisms relating to the electric discharge, mechanisms for introducing an Ar gas used for the electric discharge and the like are omitted.

The electrostatic chuck device 40 according to the present embodiment provided on the substrate support 16 is comprised of a dielectric plate 41 with an embossed surface, a metal electrode 42 provided inside the dielectric plate 41, and an external DC power circuit 24 for supplying a predetermined voltage to the metal electrode 42.

The embossed part 43 of the surface of the dielectric plate 41 is comprised of a plurality of projections 43a, depressions 43b, and an outer peripheral projection 43c. The projections 43a form extremely small columnar shapes. The surface of the embossed part 43 of the dielectric plate 41 is provided with conductor wiring 44 (shown in FIG. 3 to FIG. 6) covering the top surfaces (substrate supporting surfaces) of all of the plurality of projections 43a and electrically connecting all of the plurality of projections. The embossed part 43 and the conductor wiring 44 will be explained in detail later.

A hole 45 is formed at the center of the dielectric plate 41. This hole 45 is provided in it with a conductor shaft 46. The bottom of the conductor shaft 46 has a conductor 47 connected to it. The conductor 47 is led to the outside and is connected to the ground through a switch 48.

The metal electrode 42 has a bipolar electrode structure comprised of an inside electrode 42a and an outside electrode 42b. The metal electrode 42 is connected to an external DC power circuit 24 and is supplied with a predetermined voltage. The external DC power circuit 24 is provided with a battery 24a for supplying a plus voltage, a battery 24b for supplying a minus voltage, a ground terminal 24c, and switches 24d and 24e. The inside electrode 42a is supplied with a plus voltage by the battery 24a, the switch 24d, and a conductor 49. Further, the external electrode 42b is supplied with a minus voltage by the battery 24b, the switch 24e, and a conductor 50.

The substrate temperature regulator 19 is comprised of a thermocouple 25, a power source/control mechanism 26, and a heating/cooling unit 27.

Further, a gas is introduced into the clearances 51 formed between the dielectric plate 41 and the substrate 17 from a gas supply source 28 through a gas introduction path 29. The introduced gas maintains the pressure in the clearances 51 at a predetermined level. Further, the heat conduction of the gas holds the substrate 17 at a predetermined temperature.

Figure 2:
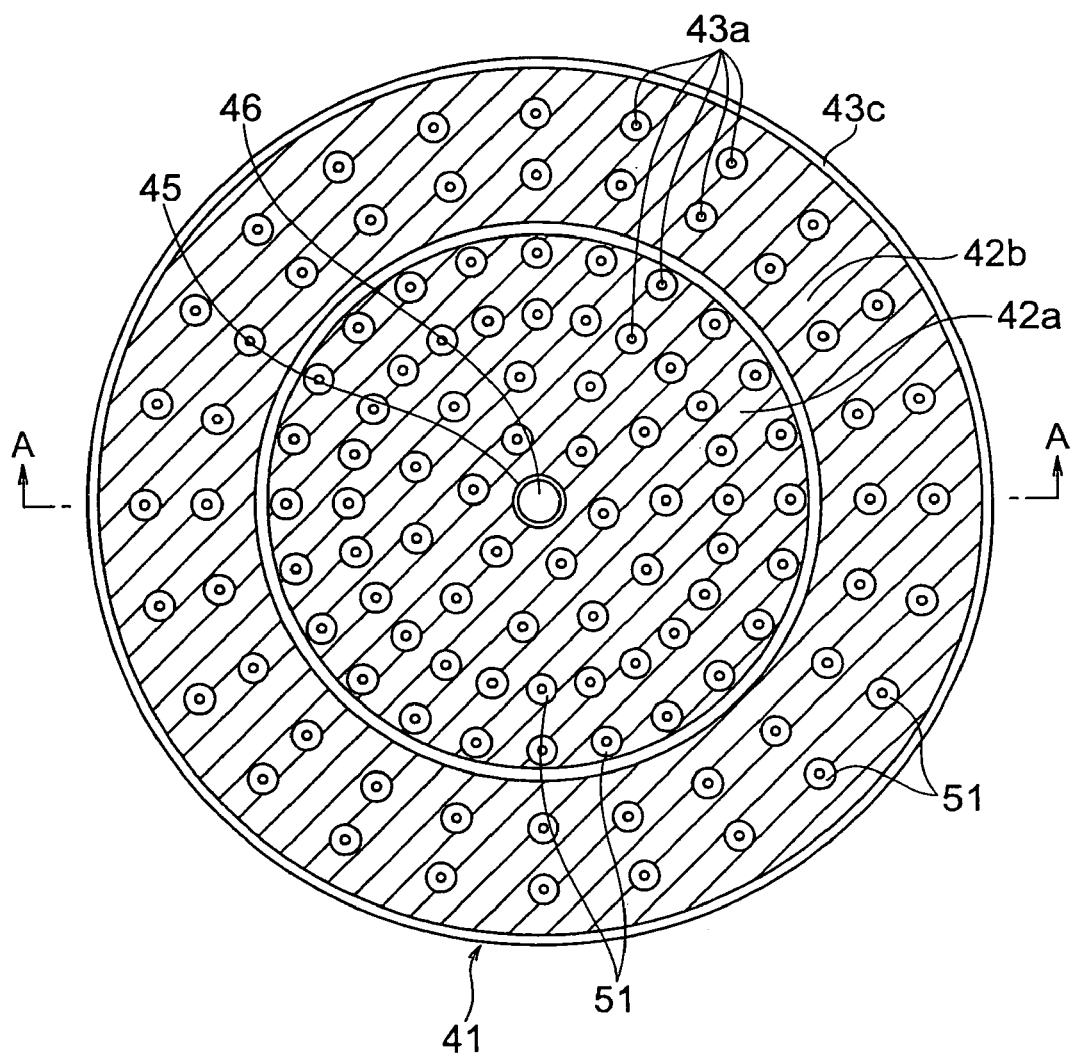
FIG. 2 is a plan view of a pattern of arrangement of an embossed part of a dielectric plate and a metal electrode.
Figure 3:
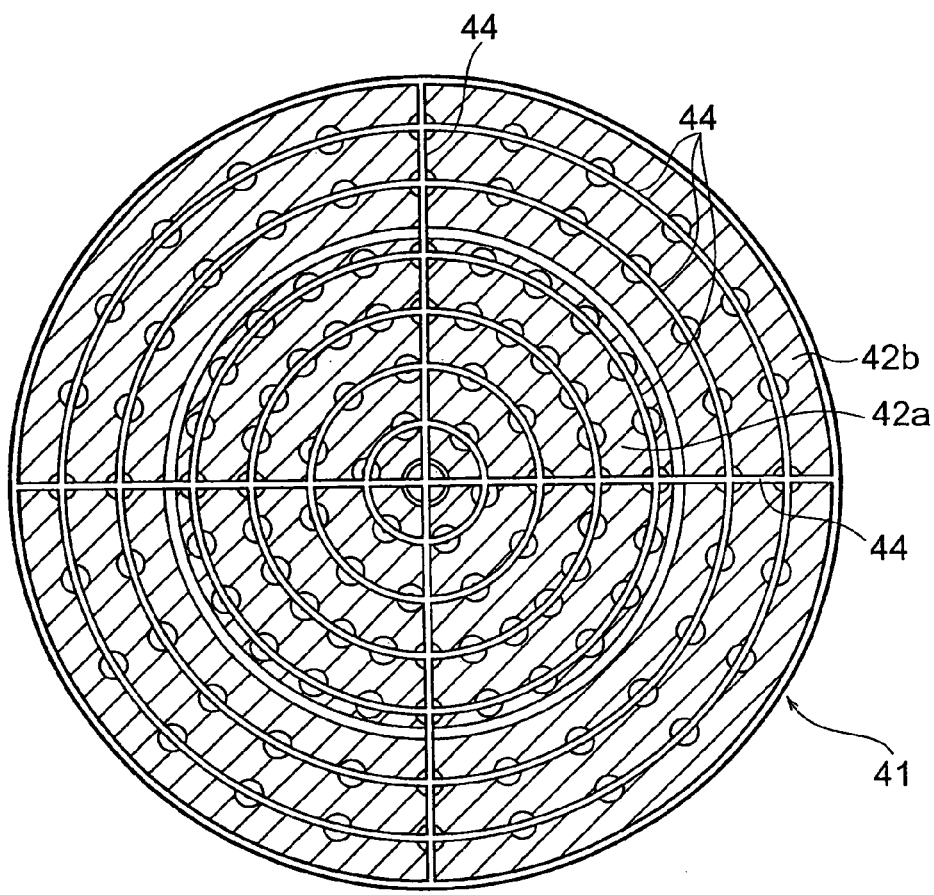
FIG. 3 is a plan view of the pattern of conductor wiring formed on the surface of the dielectric plate.
Figure 4:
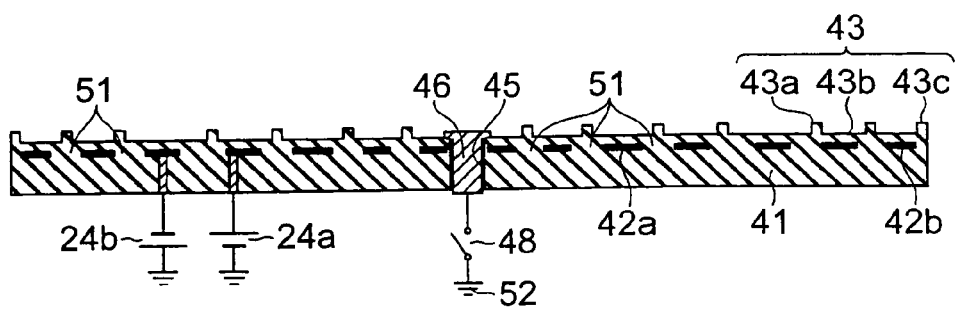
FIG. 4 is a sectional view along the line A-A in FIG. 2.

FIG. 2 is a plan view of the dielectric plate 41 and shows the pattern of formation of the embossed projections 43a and the pattern of arrangement of the metal electrode 42. In FIG. 2, for easier understanding, the state without the conductor wiring 44 is shown. FIG. 3 is a view similar to FIG. 2, but showing the pattern of formation of the conductor wiring 44. FIG. 4 is a sectional view along the line A-A in FIG. 2.

In FIG. 2 and FIG. 3, the region of the metal electrode 42 is shown by hatching. The metal electrode 42 is a bipolar electrode comprised of an inside disk-shaped electrode 42a and an outside donut-shaped electrode 42b. The areas of the electrode surfaces of the inside electrode 42a and the outside electrode 42b are substantially the same. Further, the electrode sections near the bottoms of the plurality of projections 43a of the embossed part 43 are cut away at equal distances along the shapes of the embossed projections to form circular holes 51.

In this embodiment, as shown in FIG. 4, the inside electrode 42a and the outside electrode 42b are supplied with a plus voltage from the battery 24a and a minus voltage from the battery 24b respectively. When the inside and outside electrodes 42a and 42b are supplied with the voltages, the embossed surface of the dielectric plate 41 is given charges of signs corresponding to the electrode voltages. Since a closed circuit is formed through the back of the substrate 17 being in contact with the embossed projections 43a and the like, the back surface of the substrate 17 as well is given charges of different signs from the surface of the dielectric plate 41. The coulomb force acting between the charges induced at the surface (embossed depressions) of the dielectric plate 41 and the charges at the back surface of the substrate 17 fixes the substrate 17 on the dielectric plate 41.

The coulomb force acting between the surface of the dielectric plate 41 and the substrate 17 is, as explained above, $F=\in(V^2/L^2)A/8$ in the case of a bipolar electrode (when the plus and minus electrode areas are the same).

AlN (aluminum nitride) with the good heat conductivity is used as the material of the dielectric plate 41. The substrate 17 arranged on the dielectric plate 41 is supported by a circular projection 43c formed along the outer periphery and the plurality of embossed projections 43a. The projections 43a are columnar shaped. The height of the projections 43a and the projection 43c is in the range of 5 μm to 15 μm. The radius of the projections 43a and the width of the outer peripheral projection 43c are preferably determined so that the total area supporting the substrate 17 and contacting the back of the substrate becomes about 1.5% of the total area of the dielectric plate 41.

In this embodiment, for example, when processing the substrate 17 having a diameter of 300 mm, the diameter of the dielectric plate 41 is 300 mm, the projections 43a of the embossed part 43 have diameters of 1 mm and a number thereof is about 150, and the width of the outer peripheral projection 43c is 1 mm. The plurality of projections 43a is arranged symmetrically about the center of the dielectric plate 41. In FIG. 2, the diameters of the embossed projections 43a are drawn larger than those in actuality to facilitate understanding.

The surface of the dielectric plate 41 is provided with the above-mentioned conductor wiring 44 so that the plurality of projections 43a, which are the sections supporting the substrate 17 and being in contact with the same, and the outer peripheral projection 43c are electrically connected. The arrangement pattern of the conductor wiring 44 is as shown in FIG. 3. The conductor wiring 44 forms interconnecting parts in the diametrical directions and interconnecting parts in the circumferential directions. The interconnecting parts in the diametrical directions are formed by a plurality of concentric circular parts. The conductor wiring 44 is made of titanium, tungsten, molybdenum, tantalum, or nitrides etc. and is preferably abrasion resistant material. Further, the conductor wiring 44 is preferably made of materials having coefficients of heat expansion of the same extent as the dielectric plate 41.

The conductor wiring 44 is formed by sputtering, ion plating, or other film forming methods. The thickness of the conductor wiring 44 is several μm or so. The conductor wiring 44 have good bondability with the dielectric plate 41 and will not peel off even if the temperature rises. The conductor wiring 44 is formed substantially symmetrically about the center of the dielectric plate 41 and so as to concentrate at the edges of the hole 45 formed at the center of the dielectric plate 41. By arranging the conductor wiring 44 point symmetrically, the distances from the position of the ground part 52 at the center of the dielectric plate 41 to the plurality of projections 43a are made equal and the electrical resistance of the conductor wiring 44 are made the same. The edges of the hole 45 are inclined. At the inclined part of the hole 45, the conductor wiring 44 is connected to the conductor shaft 46 filling the hole 45. The conductor shaft 46 is connected to the switch 48 of an external circuit. The conductor shaft 46 is connected to the ground through the switch 48. The conductor wiring 44 is controlled to the grounded state or the floating state by the switch 48. The conductor wiring 44, and the external circuit from the conductor shaft 46 to the switch 48, or the conductors 47, are only naturally electrically insulated from the substrate temperature regulator 19 and the vessel 11.

The processing of the substrate by the sputtering system according to the present embodiment is basically the same as explained with respect to the conventional system. In this embodiment, preferably the inside electrode 42a of the metal electrode 42 is supplied with a voltage in the range of +200 V to +1000 V, while the outside electrode 42b is supplied with a voltage in the range of −200 V to −1000 V.

Figure 5:
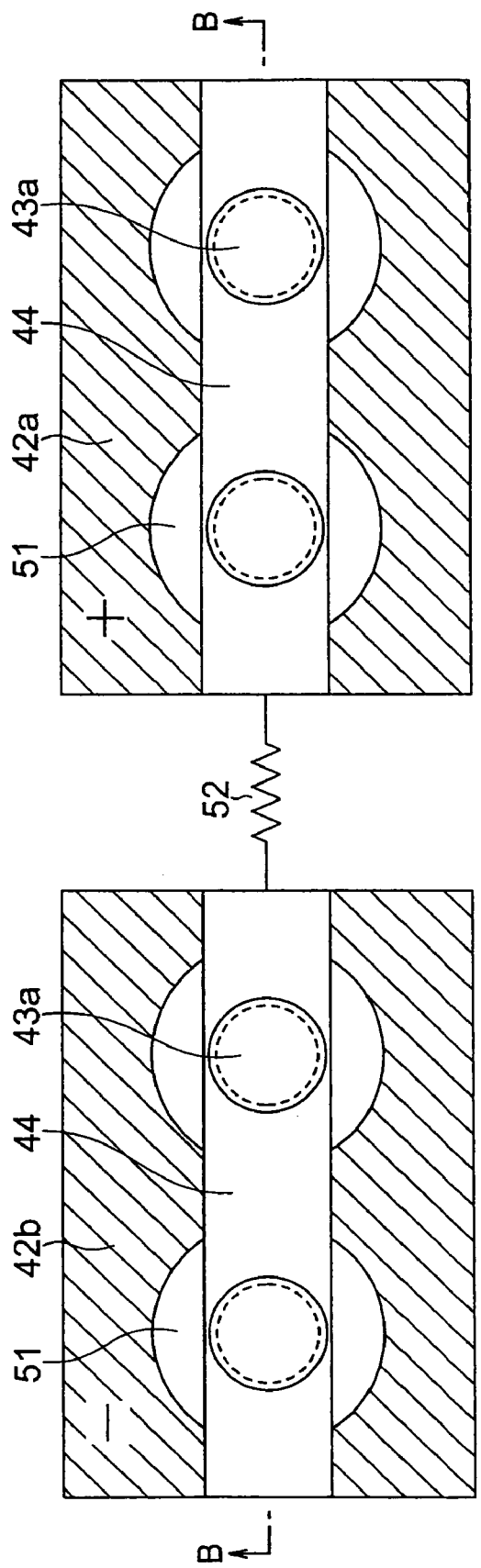
FIG. 5 is an enlarged plan view of main parts for explaining the relationship among the embossed projections, the conductor wiring, and the metal electrode.

Next, the clamping action of the substrate by the electrostatic chuck device 40 will be explained with reference to FIG. 5 and FIG. 6.

The substrate (a silicon substrate, for example) 17 is placed on the dielectric plate 41. When the inside and outside electrodes 42a and 42b are supplied with predetermined voltages of opposite polarity, the surface of the dielectric plate 41 gets charged corresponding to the potentials of the corresponding electrode parts, while the facing surface of the back of the substrate 17 gets charged with opposite signs corresponding to the corresponding locations of the surface of the dielectric plate. As a result, the electrostatic force (coulomb force) between the regions of the embossed depressions 43b of the surface of the dielectric plate 41 and the back of the substrate corresponding to these regions alone clamps and fixes the substrate 17 to the dielectric plate 41. That is, the inside electrode 42a is supplied with a plus voltage by the battery 24a, while the outside electrode 42b is supplied with a minus voltage by the battery 24b. The surface of the embossed part of the dielectric plate 41 corresponding to the inside electrode 42a gets charged to be plus, while the surface of the embossed part of the dielectric plate 41 corresponding to the outside electrode 42b gets charged to be minus. The substrate 17 is relatively low in resistance, so when the inside and outside electrodes 42a and 42b are supplied with predetermined voltages, current easily flows near the surface of the back of the substrate 17, a minus charge occurs at the section of the back of the substrate facing the plus electrode, a plus charge occurs at the section of the back of the substrate facing the minus electrode, and the potential of the substrate becomes substantially the same in absolute value as the potential of the metal electrode 42. When the charges migrate at the back of the substrate 17, the power circuit 24 and the substrate 17 form a closed circuit and a flow of charges occurs at this closed circuit.

The electrode parts near the bottom of the embossed projections 43a are removed as explained above to form the circular holes 51. As a result, the charges occurring near the top surfaces of the embossed projections 43a are reduced compared with the conventional electrostatic chuck device. This is because the amount of charges is inversely proportional to the distance between the metal electrode 42 and the surface of the dielectric plate 41. That is, the relationship of $\sigma = \in_0 V/d$ stands. Here, σ is the charge per unit surface area, V is the electrode voltage, and d is the distance between the electrode and surface.

Further, as explained above, since the embossed projections 43a are made small in shape and the areas of the top surfaces of the embossed projections 43a are also made extremely small, the amounts of charges occurring at the top surfaces of the embossed projections 43a are reduced by this as well.

The force dF per unit area acting between the substrate 17 and the dielectric plate 41 is $dF=\sigma^2/\in_0$. Therefore, the clamping force on the substrate 17 at the projections 43a of the embossed part 43 can be made smaller compared with the conventional electrostatic chuck device.

Further, the plurality of embossed projections 43a and the outer peripheral projection 43c are in contact with the back of the substrate 17. In this case, since the conductor wiring 44 covering the embossed projections 43a and the outer peripheral projection 43c is actually in contact with the back of the substrate 17, it becomes substantially the same potential as the contacted parts of the substrate. That is, although, before the contact, the conductor wiring 44 are given charges of different signs by electrostatic induction in accordance with the corresponding surface charges of the dielectric plate 41, the conductor wiring 44 tries to become the same potential as the substrate 17 by the contact with the substrate 17. After the contact, the conductor wiring 44 becomes substantially the same potential as the substrate 17, while the conductor wiring 44 is given charges of the same signs as the charges induced at the back of the substrate 17. That is, the contact resistance between the dielectric plate 41 and the conductor wiring 44 is larger than the contact resistance between the conductor wiring 44 and the substrate 17, so the conductor wiring 44 becomes substantially the same potential as the substrate 17 and is given charges of the same signs as the charges at the back of the substrate 17. Therefore, at the contact parts between the surfaces of the embossed projections 43a and outer peripheral projection 43c, or the conductor wiring 44, and the substrate 17, no electrostatic force (coulomb force) is generated and no clamping force acts. The clamping force for fixing the substrate 17 only occurs between the embossed depressions 43b and the substrate 17. Therefore, the Johnsen-Rahbek effect also does not occur at the substrate and surfaces of the embossed projections (substrate supporting surfaces) as had occurred in the conventional electrostatic chuck devices. No strong force acts between the substrate 17 and the embossed projections 43a of the dielectric plate 41, so there is very little generation of particles due to rubbing between the two.

Figure 6:
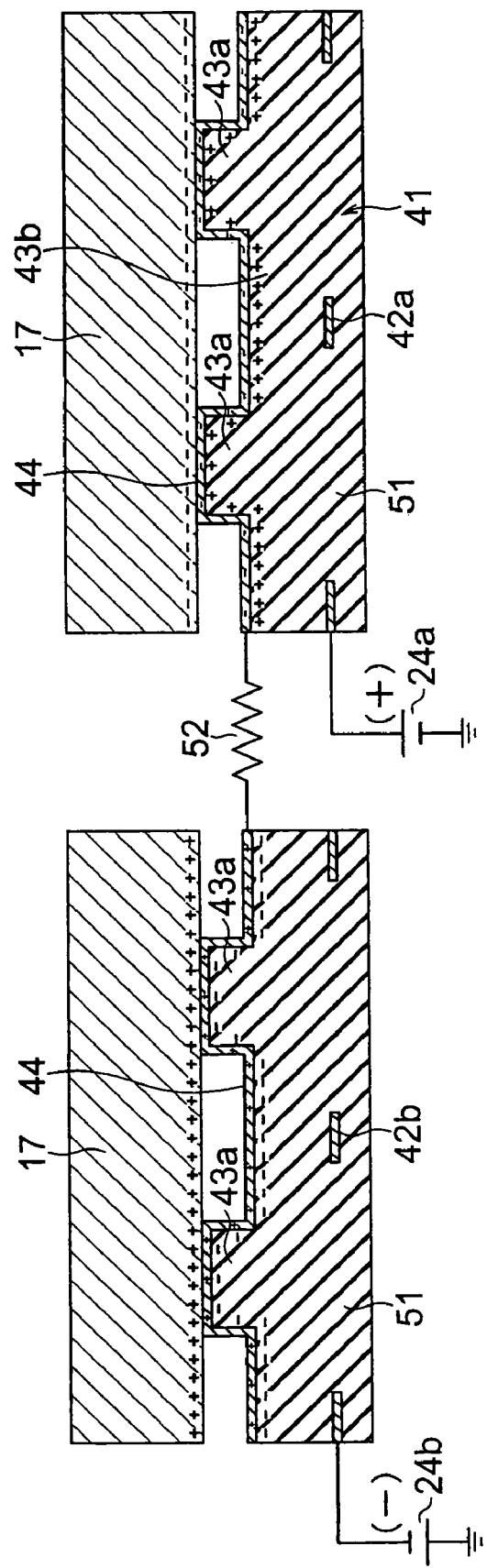
FIG. 6 is a sectional view along the line B-B in FIG. 5.

Here, the conductor wiring 44 on the embossed projections 43a becomes the same potential as the corresponding sections of the substrate 17 (minus potential at right side section in FIG. 6 and plus potential at left side section of FIG. 6). Due to the presence of the charges of different signs induced at the dielectric plate side at the interface with the dielectric plate 41 at the lower side of the conductor wiring 44 (plus charge at right side section in FIG. 6 and minus charge at left side section of FIG. 6), the charges migrate and dissipate and the force is generated by the JR effect at the interface. The phenomenon occurring at the interface, however, has nothing to do with clamping of the substrate. Further, in FIG. 5 and FIG. 6, the section of the conductor wiring 44 corresponding to the inside electrode 42a and the section of the conductor wiring 44 corresponding to the outside electrode 42b are connected through the resistance element 52 as an electrical circuit. The section of the conductor wiring 44 corresponding to the inside electrode 42a and the section of the conductor wiring 44 corresponding to the outside electrode 42b differ in signs of the charges induced as explained above. The charges of these different signs partially migrate and dissipate through the resistance element 52.

The force clamping the substrate 17 in the present embodiment will be calculated next. The force at work, as explained above, is $F=\in(V^2/L_0^2)A/8$ (when the electrode areas are the same between the plus electrode and minus electrode). Here, $\in$ is the dielectric constant, V is the voltage, $L_0$ is the distance between the surface of the metal electrode and the back of the substrate, and $A_0$ is substantially the area of the metal electrode 42. The clamping force required is strictly determined by the area which does not include the area of the conductor wiring 44. The clamping force is proportional to the square of the supplied voltage and the electrode area and is inversely proportional to the square of the distance between the substrate and dielectric plate surface. Here, when processing a substrate with a diameter of 300 mm, it is assumed that the diameter of the dielectric plate serving as the substrate support is also 300 mm, the electrode is a disk with a diameter of 298 mm, and the total area of the outer peripheral projection with a width of 1 mm and embossed projections with a diameter of 1 mm being in contacting with the substrate is 1.5% of the whole area.

The force acting when the supplied voltage is 200 V to 500 V is 500 N to 3200 N, and 50 Torr to 370 Torr in terms of pressure. This is sufficiently above the counterforce due to the approximately 10 Torr pressure difference between the pressure caused by the introduction of the gas to the clearances 51 and the internal pressure of the vessel 11 and enables stable clamping and fixing.

When the surface of the substrate is covered by $SiO_2$, however, migration of the charges at the substrate contact parts is determined by the migration of the charges at the $SiO_2$ layer and is not as easy as with the case of a silicon substrate alone. Further, the substrate and the dielectric plate do not easily become the same potential at the embossed part, so this calculation is not necessary accurate. However, no migration of charges occurs such as with the case of contact between dielectrics, so the clamping force at the embossed part is reduced compared with the prior art.

After the substrate 17 finishes being processed, the voltage stops being supplied to the electrode layer 42, and the metal electrode 42 and conductor shaft 46 are connected to the ground part by switches of an external circuit. The conductor wiring 44 connected to the conductor shaft 46 is also grounded. In this case, when the metal electrode 42 becomes the ground potential, the separation of the charges due to electrostatic induction is eliminated at the inside of the facing substrate 17 and the charges induced at the back are dissipated. Due to the conductor wiring 44 being grounded, the charges at the surfaces of the embossed projections 43a and the grounded back of the substrate flow out through the ground circuit. Due to this, the clamping force due to the embossed part 43 of the dielectric plate 41 rapidly falls.

Further, the charges induced at the back of the dielectric plate 41 remain and become a cause of residual clamping force even after the supply of voltages to the metal electrode 42 is stopped. But the residual charges at the surface of the dielectric plate 41 migrate not only to the metal electrode 42, but also the conductor wiring 44 and flow out to the ground circuit. Therefore, the residual charges at the surface of the dielectric plate rapidly drop more than in the prior arts. Therefore, the residual clamping force between the surface of the dielectric plate and the substrate also rapidly declines compared with the prior art.

The release of the charges can be superior compared with the prior art even when the substrate is covered with $SiO_2$. The reason is that the only grounded electrode where the charges were released in the prior art was the internal metal electrode, but in the present embodiment the conductor wiring 44 are added in addition to the metal electrode 42. In particular, the charges near the conductor wiring 44 rapidly decline. This is because the speed of the fall in a residual charge is heavily dependent on the distance to the electrode where the charge dissipates. As a result, the overall residual charge also falls and the residual clamping force between the surface of the dielectric plate and the substrate rapidly falls compared with the prior art.

Due to the above, the substrate clamping force drops off instantaneously from when voltages stop being supplied to the inside and outside electrode layers 42a and 42b and the clamping force due to the residual charge does not continue long. Therefore, even if the substrate starts to be unloaded immediately after the voltages stop being supplied to the metal electrode 42, the substrate will not vibrate and no positional deviation will occur.

According to the above electrostatic chuck device, when inspected experimentally, the about 50,000 particles generated at the back when processing the substrate of a diameter of 300 mm in the prior art was reduced to less than about 5000. Due to this, the yield in production also became extremely improved.

The electrostatic chuck device according to the above embodiment can be applied to CVD for depositing thin films on the substrates or dry etching for processing the thin film in addition to sputtering. Further, in the present embodiment, the explanation was given with respect to a bipolar electrode, but it may be similarly applied to a unipolar electrode as well. In the case of a unipolar electrode as well, circular holes 51 are formed at locations corresponding to the embossed projections and conductor wiring 44 having the above pattern of arrangement are formed on the surface of the embossed sections 43. In the case of a unipolar electrode, it is sufficient for example to make the inside electrode 42a and outside electrode 42b integrally and supply a plus or minus voltage.

According to the above-mentioned first embodiment, it is possible to provide an electrostatic chuck device for clamping and fixing a substrate by the coulomb force between the embossed surface of a dielectric plate and the back of the substrate which covers the top surfaces of the plurality of embossed projections by conductor wiring and electrically connects all embossed projections, so has no strong force acting on the contact parts between the substrate and dielectric plate and suppresses the generation of particles due to rubbing. A conducting path is provided for the escape of the charges by grounding the conductor wiring, so there are little residual charges, the clamping force can be made to drop off instantaneously after the voltages stop being supplied to the electrode, and therefore the substrate can be taken out and conveyed stably after processing the substrate. Due to this, the yield is high and substrates can be processed with a high operating rate.

Next, an electrostatic chuck device according to a second embodiment will be explained with reference to FIG. 7 to FIG. 12. In this embodiment as well, the explanation will be given of an example of an electrostatic chuck device applied to a sputtering system.

Figure 7:
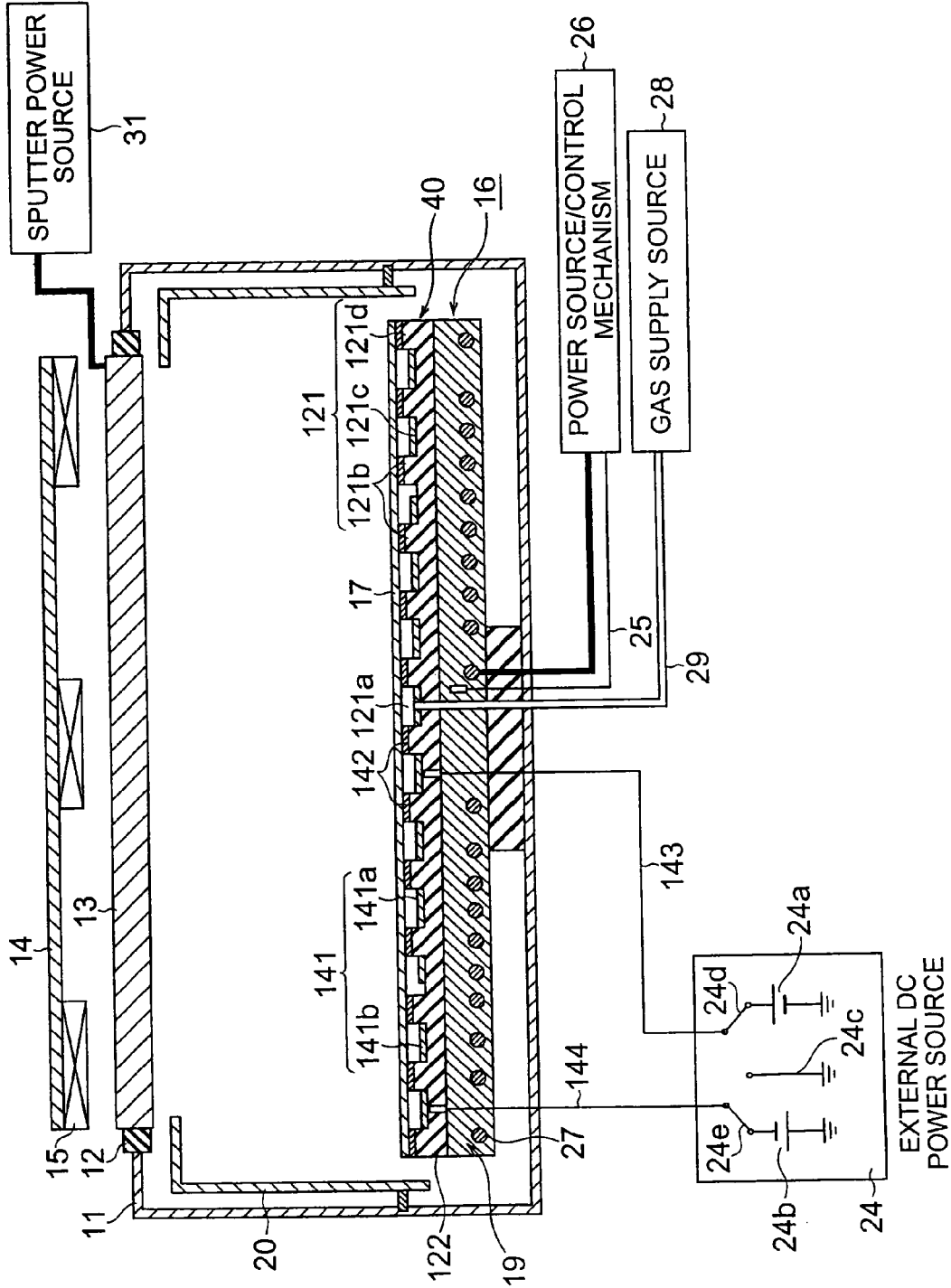
FIG. 7 is a longitudinal sectional view of a sputtering system to which an electrostatic chuck device according to a second embodiment of the present invention is applied.

In FIG. 7, the basic sections of the sputtering system are the same as in the conventional system of FIG. 23. Components the same as the components explained in FIG. 23 are assigned the same reference numerals, and detail explanations thereof are omitted.

The electrostatic chuck device 40 according to the present embodiment provided on the substrate support 16 is comprised of a dielectric plate 122 with an embossed surface, a metal or other electrode layer 141 provided on the surface of the dielectric plate 122, and an external DC power circuit 24 for supplying the electrode layer 141 with a predetermined voltage.

The embossed part 121 on the surface of the dielectric plate 122 is comprised of a plurality of projections 121b, depressions 121c, and an outer peripheral projection 121d. The projections 121b form columnar shapes. The outer peripheral projection 121d has a ring shape. The outer peripheral projection 121d is included in the "projections" in concept. The embossed part 121 of the dielectric plate 122 forms clearances 121a at the back of the substrate 17. At the embossed part 121 of the dielectric plate 122, all of top surfaces (substrate supporting surfaces) of the plurality of projections 121b are provided with conductor layers 142. As the material of the dielectric plate 122, AlN (aluminum nitride) having good heat conductivity is used.

The electrode layer 141 is arranged at the bottom of the depressions 121c of the embossed part 121. The electrode layer 141 has the structure of a bipolar electrode comprised of a disk-shaped inside electrode layer 141a and ring-shaped outside electrode layer 141b. The electrode layer 141 is produced from tungsten, molybdenum, tantalum, or another metal or a carbon-based conductor having a coefficient of heat expansion of the same extent as the dielectric layer 122.

Figure 9:
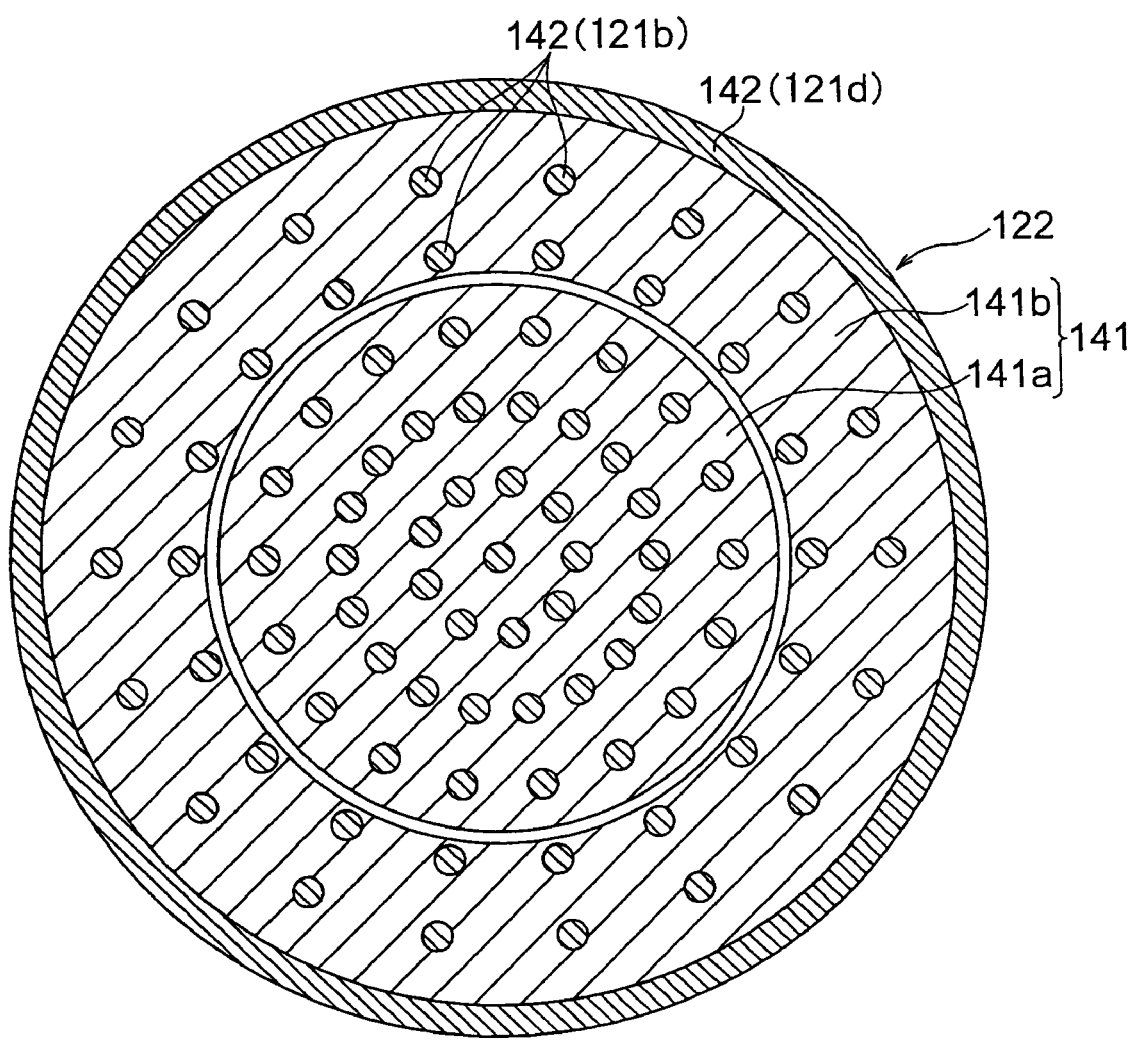
FIG. 9 is a plan view of the pattern of arrangement of the embossed part of the dielectric plate and an electrode layer.

FIG. 9 shows a plan view of the dielectric plate 122 and shows the pattern of formation of the embossed projections 121b and the pattern of arrangement of the electrode layer 141. In FIG. 9, the diameters of the embossed projections 121b are drawn larger than in actuality so as to facilitate understanding. In FIG. 9, the region of the electrode layer 141 is shown by hatching. The electrode layer 141 is comprised of two parts of an inside disk-shaped electrode 141a and an outside donut-shaped electrode 141b. The electrode layer 141 is provided at the location of the embossed depressions 121c of the surface of the dielectric plate 122. Note that the embossed projections 121b have the conductor layer 142 formed on them, so FIG. 9 shows circular conductor layers 142 at the locations of the embossed projections 121b. Further, the rim section of the outside of the dielectric plate 122 is formed with a ring-shaped outer peripheral projection 121d and formed on top of that with a ring-shaped conductor layer 143.

The electrode layer 141 is formed by ion plating etc. and has a thickness of several μm to several tens of μm or so. The electrode layer 141 has good bondability with the dielectric plate 122 and does not peel off when the temperature rises. The electrode layers 141a and 141b have a DC current source connected to them through an external circuit. That is, the electrode layer 141 is connected to the external DC power source 24 and supplied with a predetermined voltage. The external DC power source 24 is provided with a battery 24a for supplying a plus voltage, a battery 24b for supplying a minus voltage, a ground terminal 24, and switches 24d and 24e. The inside electrode layer 141a is supplied with a plus voltage by the battery 24a, switch 24d, and conductor 143, while the outside electrode layer 141b is supplied with a minus voltage by the battery 24b, switch 24e, and conductor 144. Further, the electrode layers 141a and 141b are grounded by the ground terminal 24c of the external DC power circuit 24.

When the inside electrode layer 141a and the outside electrode layer 141b are supplied with a plus voltage from the battery 24a and a minus voltage from the battery 24b respectively, the surfaces of the embossed projections 121b of the dielectric plate 122 are given charges of signs corresponding to the electrode voltages.

The electrode layer 141 is formed by forming a film on the dielectric plate 122, so is electrically insulated from the substrate temperature regulator 19. Further, the conductors 143 and 144 forming the electrical connections with the external DC power circuit 24 are also electrically insulated from the substrate temperature regulator 19 or vessel 11.

Figure 8:
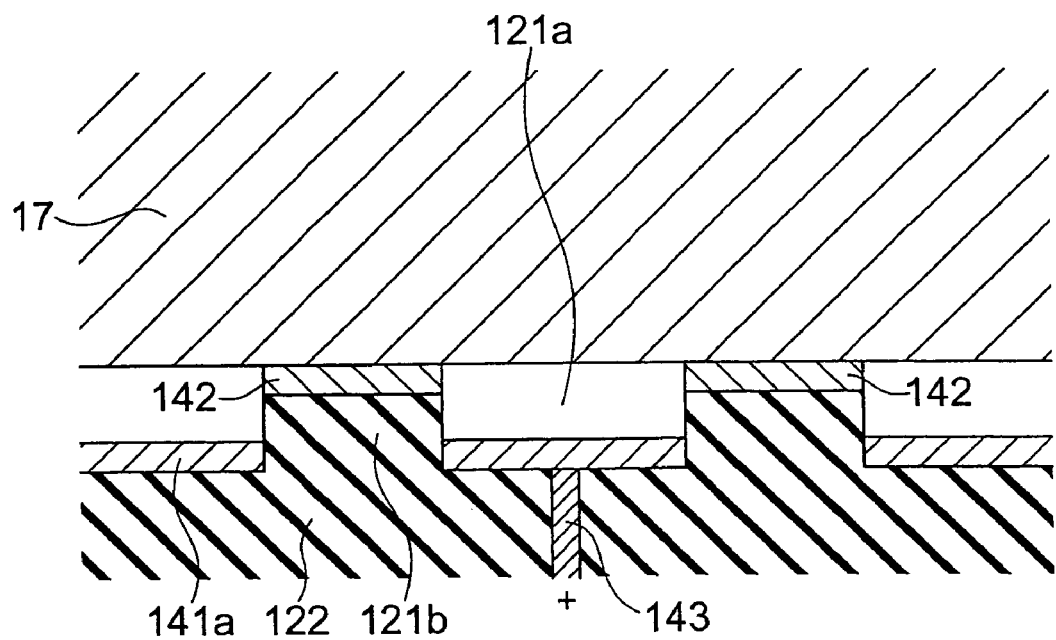
FIG. 8 is an enlarged longitudinal sectional view of the state of contact between the embossed part of the dielectric plate and a substrate.

As shown enlarged in FIG. 8, the top surfaces of the embossed projections 121b are formed with conductor layers 142. The conductor layers 142 are made of a metal having a coefficient of heat expansion of the same extent as the dielectric plate 122 and, for example, may be tungsten, molybdenum, tantalum, or, other than a metal, a carbon-based material. The conductor layers 142 are electrically insulated from the electrode layer 141. The conductor layers 142 are similarly formed by ion plating etc. and have a thickness of several Fm to several tens of Fm. They have a good bondability with the dielectric plate 122 and do not peel off even if the temperature rises. The top surfaces of the embossed projections 121 are inherently sections directly being in contact with the substrate 17. A conductor layer 142 is also formed at the surface of the ring-shaped outer peripheral projection 121d of the dielectric plate 122 contacting the substrate 17 in addition to the embossed projections 121b.

Figure 10:
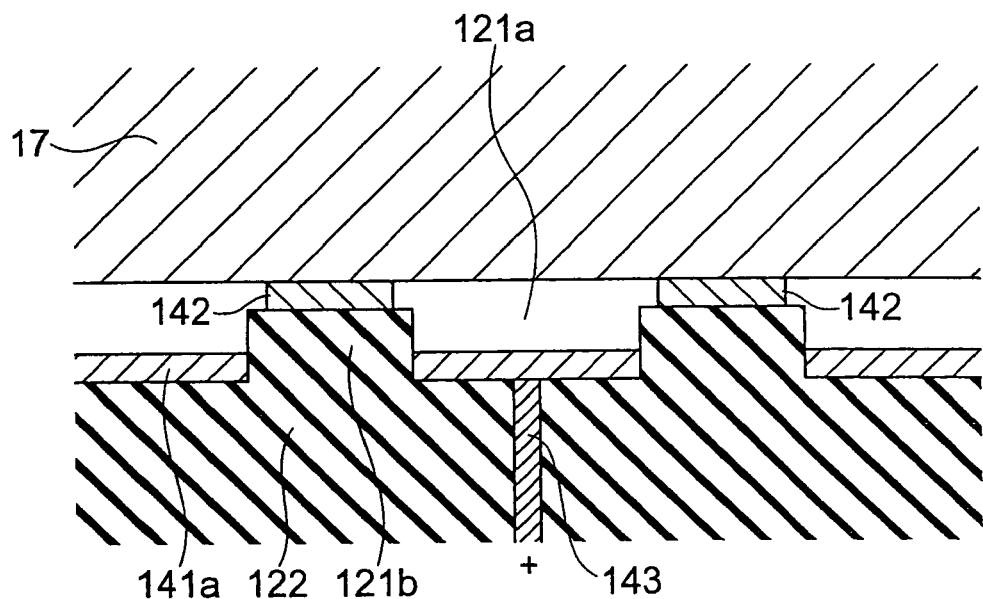
FIG. 10 is an enlarged longitudinal sectional view of another example of the state of contact between the embossed part of the dielectric plate and the substrate.
Figure 11:
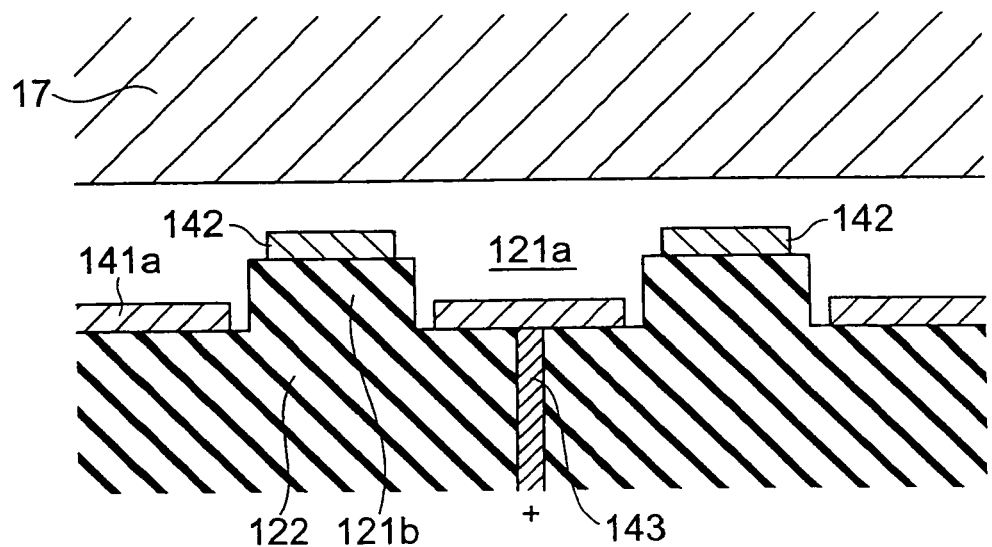
FIG. 11 is an enlarged longitudinal sectional view of the state where the substrate is separated in another example of the state of contact between the embossed part of the dielectric plate and the substrate.

To ensure insulation between the electrode layer 141 (141a, 141b) and the conductor layers 142, as shown in FIG. 10 and FIG. 11, preferably the range where the conductor layers 142 are formed is either made inside from the range of the top surfaces of the embossed projections 121b or the range where the dielectric layer 142 is formed is made inside from the range of the top surfaces of the embossed projections 121b and the electrode layer is not formed near the peripheries of the step differences of the embossed part. That is, preferably it is not arranged linearly in the height direction at locations where step differences are formed between the edge parts of the electrode layer and the edge parts of the conductor layers.

Further, gas is introduced into the clearances 121a formed between the dielectric plate 122 and the substrate 17 from the gas supply source 28 through the gas introduction path 29. The introduced gas holds the pressure in the clearances 121a at a predetermined pressure. Further, the heat conduction of the gas holds the substrate 17 at a predetermined temperature.

Figure 12:
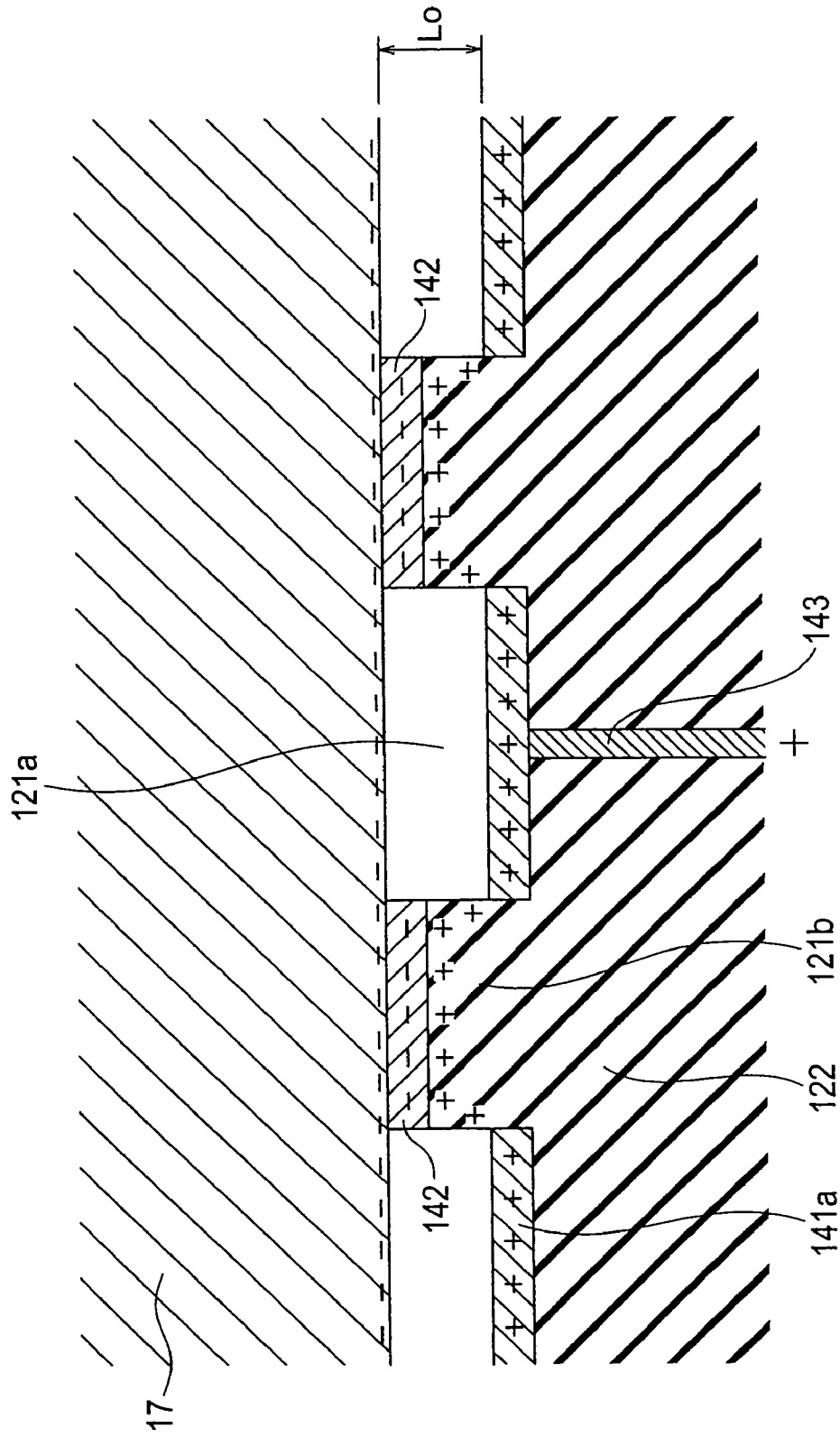
FIG. 12 is an enlarged longitudinal sectional view of the supply of voltage and the induced charges in the state of contact between the embossed surface of the dielectric plate and the substrate.

The processing of the substrate by the sputtering system according to the present embodiment is basically the same as the content explained with respect to the above-mentioned embodiment. In this embodiment, preferably the inside electrode 141a of the electrode layer 141 is supplied with a voltage in the range of +200 to +1000 V, while the outside electrode 141b is supplied with a voltage in the range of −200 V to −1000 V. When the electrodes 141a, 141b are supplied with voltages, as shown in FIG. 12, the back of the facing substrate 17 is given charges of different signs from the signs of the electrode potential, and the electrostatic force clamps the substrate 17 and fixes it on the dielectric plate 122.

Next, the action of the electrostatic chuck device 40 in clamping a substrate will be explained in detail with reference to FIG. 12.

The substrate 17 is placed on the dielectric plate 22. When the inside and outside electrodes 141a and 141b are supplied with predetermined voltages, the back surface of the substrate 17 is given charges of signs corresponding to the potential of the corresponding electrodes. As a result, the electrostatic force fixes the substrate 17 to the dielectric plate 122. The substrate 17 is relatively low in resistance, so when the inside and outside electrodes 141a and 141b are supplied with predetermined voltages, current easily flows near the surface of the back of the substrate 17, a minus charge occurs at the section of the back of the substrate facing the plus electrode layer, a plus charge occurs at the section of the back of the substrate facing the minus electrode layer, and the potential of the substrate becomes substantially the same in absolute value as the potential of the electrode layer 141. When the charge migrates at the back of the substrate 17, the power circuit 24 and the substrate 17 form a closed circuit and a flow of charges occurs at this closed circuit.

On the other hand, the top surfaces of the embossed projections 121b are in contact with the back of the substrate 17, but the dielectric layers 142 of the projections 121b become the same potential as the back sections of the substrate 17 contacted. Therefore, no electrostatic force is generated between the surfaces of the embossed projections 121b and the substrate 17 and no electrostatic force acts. Therefore, the Johnsen-Rahbek effect does not occur at the contact parts of the substrate 17 and the embossed parts 121 of the dielectric plate 122, that is, the embossed surface, and no strong force acts there, so there is very little generation of particles due to rubbing.

Here, the dielectric layers 142 at the top surfaces of the embossed projections 121b become substantially the same in potential as the substrate 17 (minus potential in FIG. 12), but the presence of charges of different signs (plus charge in FIG. 12) induced at the dielectric plate side of the interface with the dielectric plate 122 below it (interface with top surfaces of embossed projections) causes the migration and dissipation of the charges and generation of force by the Johnsen-Rahbek effect at the interface. However, this phenomenon occurring at the interface has nothing to do with the clamping of the substrate.

The force clamping the substrate 17 in the present embodiment will be calculated next. The force at work, as explained above, is $F=\in(V^2/L_0^2)A/8$ (when the electrode areas are the same between the plus electrode and minus electrode). Here, $\in$ is the dielectric constant, V is the voltage, $L_0$ is the distance between the surface of the metal electrode and back of the substrate, and $A_0$ is substantially the area of the metal electrode 141. The clamping force is proportional to the square of the supplied voltage and the electrode area and is inversely proportional to the square of the distance between the substrate and dielectric plate surface.

Here, assume the case of processing a substrate of a diameter of 300 mm, making the diameter of the dielectric plate 122 serving as the substrate support also 300 mm, making the surface of the electrode layer 141 a disk of a diameter of 298 mm, and assuming the total area of the outer peripheral projection of a width of 1 mm and embossed projections of diameters of 1 mm contacting the substrate 1% of the total area.

The force acting when the supplied voltage is 200 V to 500 V is 500 N to 3200 N, or 50 Torr to 370 Torr in terms of pressure. This is sufficiently above the counterforce due to the pressure difference between the pressure caused by the introduction of the gas to the clearances 121a and the internal pressure of the vessel 11 and enables stable clamping and fixing.

When the surface of the substrate is covered by $SiO_2$, however, migration of the charges at the substrate contact parts is determined by the migration of the charges at the $SiO_2$ layer and is not as easy as with the case of a silicon substrate alone. Further, the substrate and the dielectric plate do not easily become the same potential at the embossed part, so this calculation is not necessary accurate. However, no migration of charges occurs such as with the case of contact between dielectrics, so the clamping force at the embossed part is reduced compared with the prior art.

After the substrate 17 finishes being processed, the voltage stops being supplied to the electrode layer 141 and the electrode layer 141 is connected to the ground part 24c by the switches 24d and 24e of an external circuit. When the electrode 41 becomes the ground potential, the separation of the charges due to electrostatic induction is eliminated at the inside of the facing substrate 17 and the charges induced at the back of the substrate are dissipated. As a result, the electrostatic force which had acted between the electrode layer 141 and the substrate 17 is rapidly decreased and the clamping force dissipates.

However, since the charges induced at the sections of the dielectric plate at the surfaces of the projections 121b of the embossed part 121 remain, charges of different signs remain at the back sections of the substrate near the projections 121b. However, the dielectric layers 142 formed at the surfaces of the embossed projections 121b continue to be about the same potential as the substrate 17, no electrostatic force acts between the substrate and the dielectric plate, and no clamping force is generated. No clamping force is generated between the substrate and the dielectric plate due to the residual charges of those sections.

Due to the above, the substrate clamping force drops off instantaneously from when voltages stop being supplied to the inside and outside electrode layers 141a and 141b and the clamping force due to the residual charges does not continue long. Therefore, even if the substrate starts to be unloaded immediately after the voltage stops being supplied to the metal electrode 142, the substrate will not vibrate and not deviate in position.

According to the electrostatic chuck device according to the present invention, when inspected experimentally, the about 50,000 particles generated at the back when processing a substrate of a diameter of 300 mm in the prior art was reduced to less than about 5000. Due to this, the yield in production also became extremely improved.

The electrostatic chuck device according to the above embodiment can be applied to CVD for forming a thin film on a substrate or dry etching for processing a thin film in addition to sputtering. Further, in the present embodiment, the explanation was given with respect to a bipolar electrode, but the invention may be similarly applied to a unipolar electrode as well.

According to the above second embodiment, it is possible to provide an electrostatic chuck device for clamping and fixing a substrate by the coulomb force between the embossed surface of a dielectric plate and the back of a substrate which forms an electrode layer on the surface of the embossed depressions and forms dielectric layers on the top surfaces of the plurality of embossed projections, so holds the contact parts with the substrate at the same potential, has no strong force acting on the contact parts between the substrate and dielectric plate, and suppresses the generation of particles due to rubbing. After the substrate finishes being processed, the clamping force can be made to drop off instantaneously after the voltage stops being supplied and therefore the substrate can be taken out and conveyed stably. Due to this, the yield is high and substrates can be processed with a high operating rate.

Next, an electrostatic chuck device according to a third embodiment will be explained with reference to FIG. 13 and FIG. 14. In this third embodiment, the explanation will be given showing only the section of the electrostatic chuck device 40.

Figure 13:
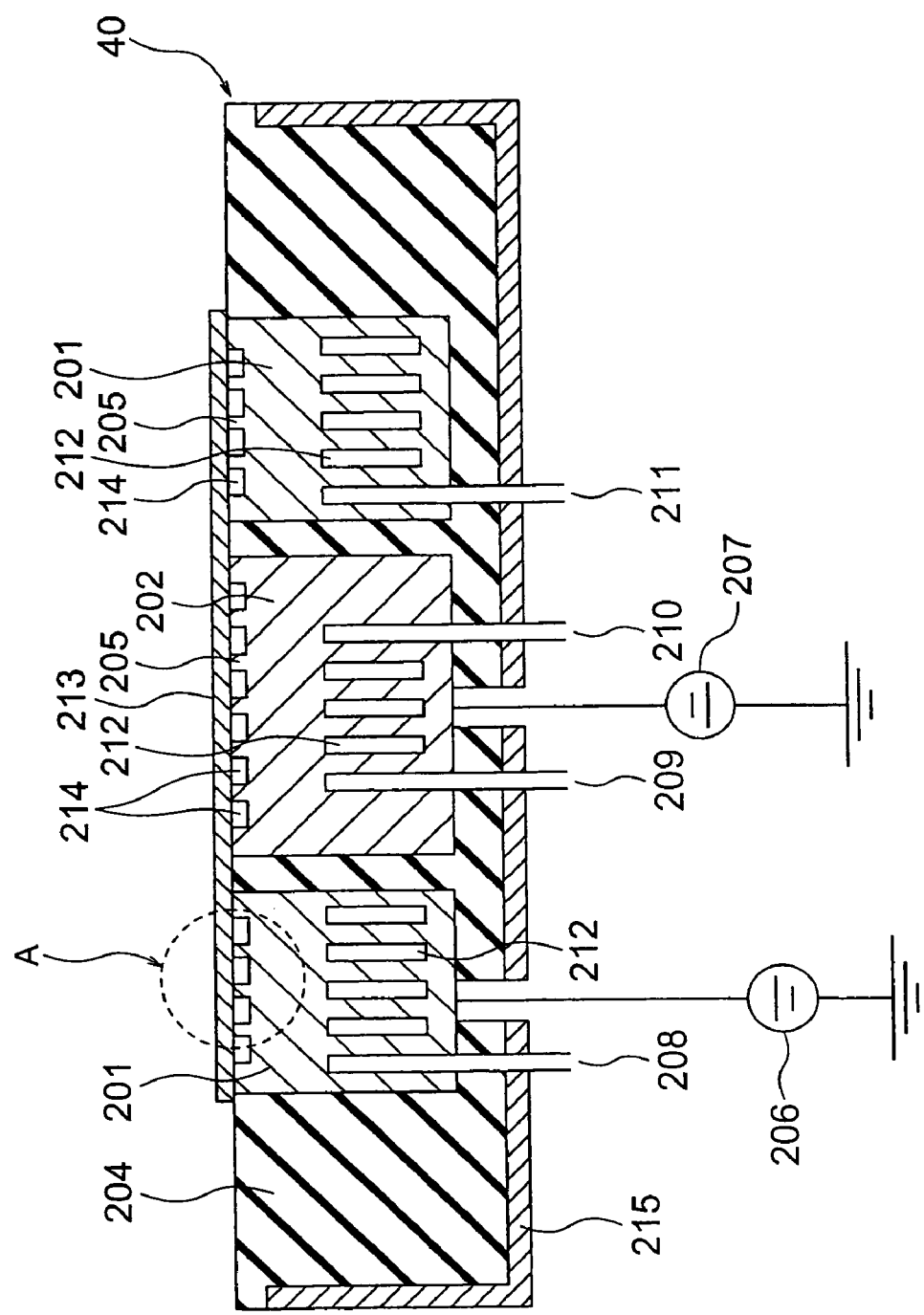
FIG. 13 is a longitudinal sectional view of key parts of an electrostatic chuck device according to a third embodiment of the present invention.
Figure 14:
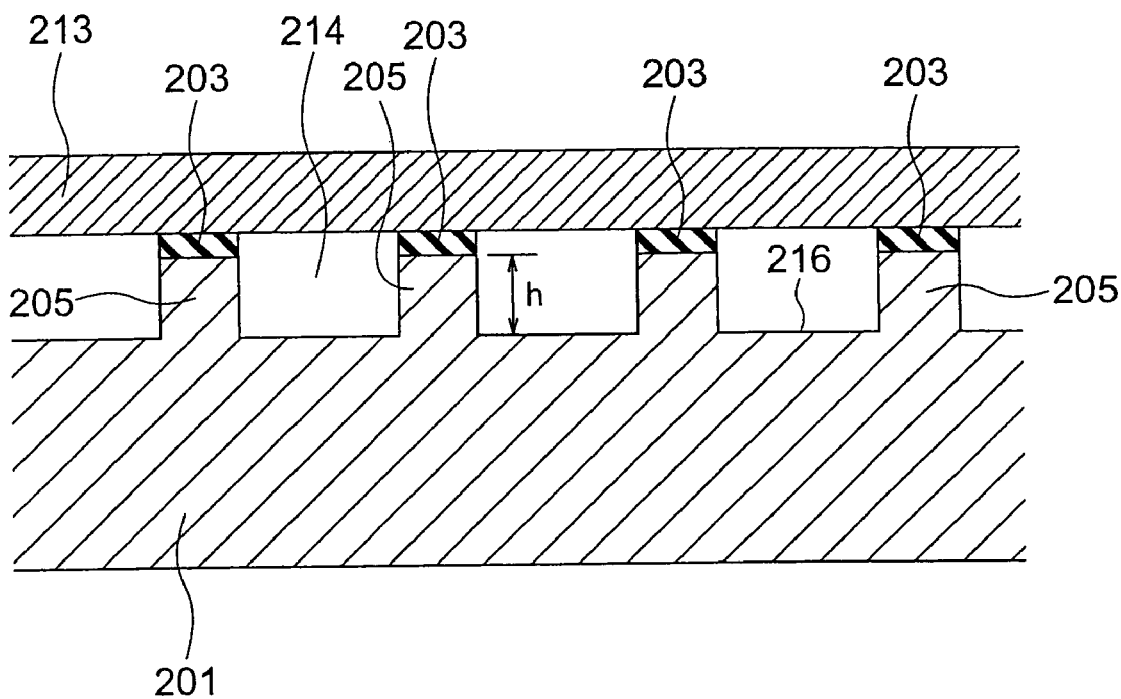
FIG. 14 is an enlarged sectional view of a circle section A shown by FIG. 13.

In FIG. 13 and FIG. 14, to facilitate the explanation, the configuration of a bipolar electrostatic chuck device illustrated enlarged in the thickness direction is shown. FIG. 13 is an enlarged longitudinal sectional view of an electrostatic chuck device 40, while FIG. 14 is a longitudinal sectional view of the location "A" in FIG. 13. The electrostatic chuck device 40 is comprised of metal electrodes 201 and 202, thin dielectric layers 203, and a thick insulating case 204. The metal electrodes 201 and 202 are formed on their top surfaces with a plurality of embossed projections 205. Normally, the embossed projections 205 are circular in shape in a horizontal cross section. However, the embossed projections 205 are not limited to this shape. When the horizontal sectional shape of the embossed projections 5 is circular, the diameter is in the range of 1 to 5 mm. The size of the diameter is not important, but a smaller diameter is more preferable to control the generation of particles. The height (h) of the embossed projections 205 is about 10 μm or larger. The height can also be increased to several mm. The top surfaces of the embossed projections 205 are covered by the thin dielectric layers 203. The thickness of the dielectric layers 203 is preferably made smaller than 1 μm. The reduction of the thickness increases the efficiency of declamping of the substrate. The electrical resistance of the dielectric layers 203 is not important. However, a dielectric material doped with a required impurity is more advantageous.

The thickness of the metal electrodes 201 and 202 are not important and may be in the range of several mm to several cm. Each of the metal electrodes 201 and 202 may or may not be provided with a cooling or heating mechanism. For example, both of the metal electrodes 201 and 202 shown in FIG. 13 have cooling mechanisms (208, 209, 210, 211). The cooling mechanisms are comprised of cooling medium inlets (208, 210), cooling medium exits (209, 211), and passages 212 for carrying the cooling medium.

The surfaces of the metal electrodes 201 and 202 are covered by an insulating material 204 everywhere except for the top sides. The object is to electrically insulate the metal electrodes 201 and 202 from the remaining parts of the hardware. Further, the surfaces of the sides and bottom of the insulating material 204 are covered by a metal case 215. The metal electrodes 201 and 202 are electrically connected with two different DC voltage sources 206 and 207.

Figure 15:
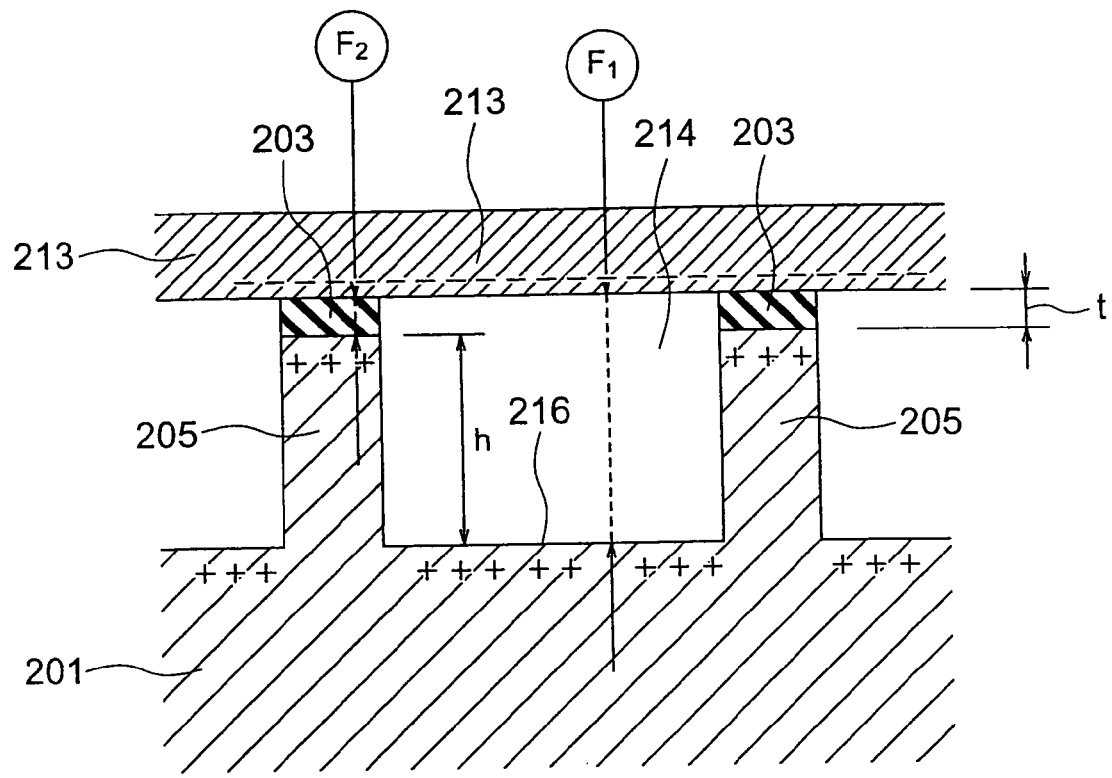
FIG. 15 is an enlarged sectional view of the configuration of embossed projections and the distribution of charges at the metal electrode and substrate in a third embodiment.

Next, the operation of the bipolar electrostatic chuck device will be explained. When giving two different bias voltages to the metal electrodes 201 and 202, as shown in FIG. 15, charges are generated on the surfaces of the metal electrodes 201 and 202 and the substrate 213. Two electrostatic forces ($F_1$, $F_2$) are generated based on the distribution of the charges. The force $F_1$ is generated between the substrate 213 and the surface of the metal electrode called the "depressions 216". The force $F_2$ is generated between the substrate 213 and the top surfaces of the metal embossed projections 205. The height (h) of the embossed projections 205 is larger than 10 μm and the thickness (t) of the dielectric layers 203 is smaller than 1 μm. Therefore, the force $F_1$ is smaller by about four orders than the force $F_2$. Therefore, the substrate 213 is inherently fixed on the electrostatic chuck device 40 by the force $F_2$.

Figure 16:
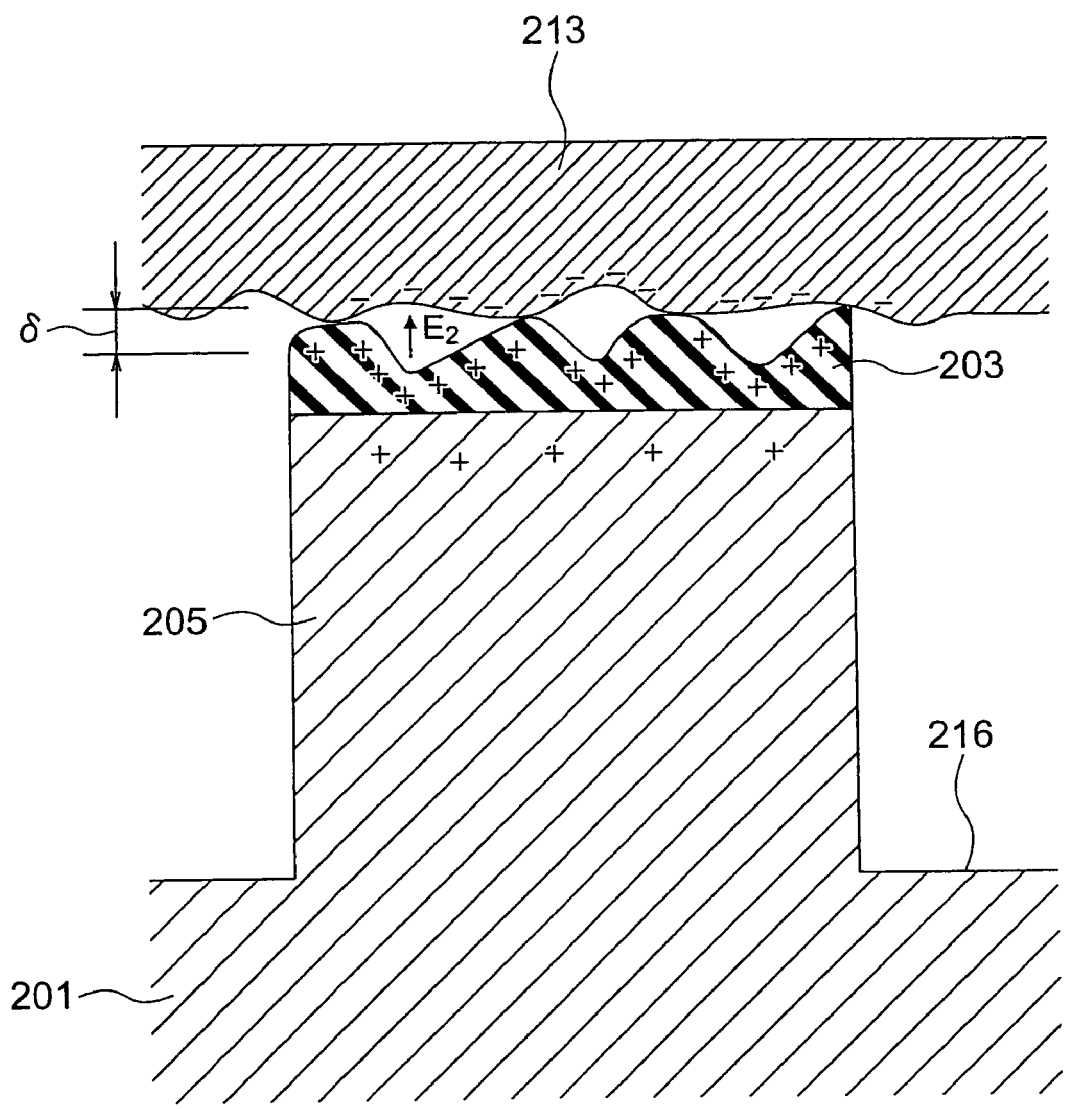
FIG. 16 is an enlarged sectional view of the distribution of charges at the top parts of the embossed projections.

Ease of declamping of the substrate is achieved by the above configuration. An accumulation of the charges occurs on the top surface of the dielectric layers 203 when a bias voltage is given to the metal electrodes. This state is shown in FIG. 16. However, the thickness of the dielectric layers 203 is about three orders smaller than that of the conventional device. Therefore, when the metal electrodes 201 and 202 are grounded to release the substrate, the accumulated charges are finally neutralized by the current re-flow process. Further, use of dielectric layers doped with an impurity further accelerates the declamping process.

The reduction in the particles generated is achieved by the above configuration. In the electrostatic chuck device 40 according to the present embodiment, the dielectric layers 203 on the metal embossed projections 205 are extremely thin. For example, the thickness is about 100 nm. Therefore, the increase in the electrostatic force along with the elapse of time due to the migration of charges through the thin dielectric layers 203 does not result in any important changes. Further, since the dielectric layers 203 are extremely thin, the migration of the charges to the top surfaces of the thin dielectric layers 203 is completed within an extremely short time period. Therefore, it became possible to accurately calculate the voltage which has to be supplied to generate the electrostatic force required. Further, this force can be considered to be almost constant and does not remarkably increase along with the elapse of time. This prevents the generation of too strong an electrostatic force and reduces the generation of particles.

Figure 17:
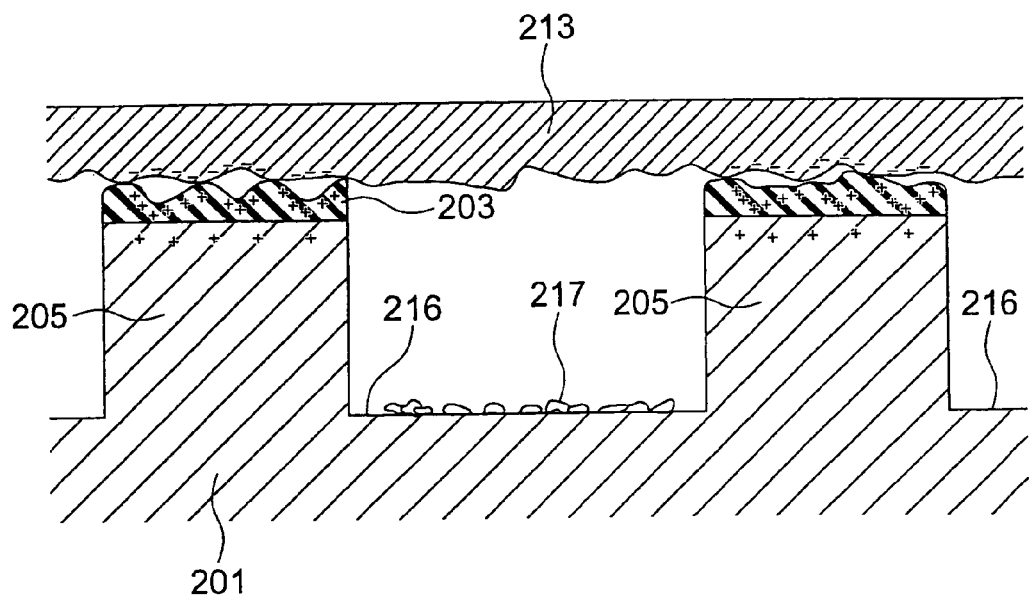
FIG. 17 is an enlarged sectional view of the state of distribution of charges between two embossed projections where particles have accumulated.

The electrostatic chuck device of the third embodiment is further characterized by a reduction in particle contamination. The embossed projections 205 produced on the metal electrodes 201, 202 are considerably higher than those of the conventional devices. If particles are generated, a larger percentage of the particles 217 deposit in the depressions 216 of the metal electrodes 210, 202. This condition is shown in FIG. 17. The reduction in particles sticking on the back of the substrate 213 may be explained as being due to two reasons. The first reason is that the embossed projections 205 are larger in height, for example, are about 1 mm, so re-sticking of particles due to turbulence in the inert gas is reduced. The second reason is the larger distance between the back of the substrate and the particles is equal to the heights of the embossed projections. Due to this, the electrostatic force between the particles and the back of the substrate is reduced. This minimizes the sticking of particles on the back of the substrate due to electrostatic force. These two processes help to minimize the number of particles at the back of the substrate.

Figure 18:
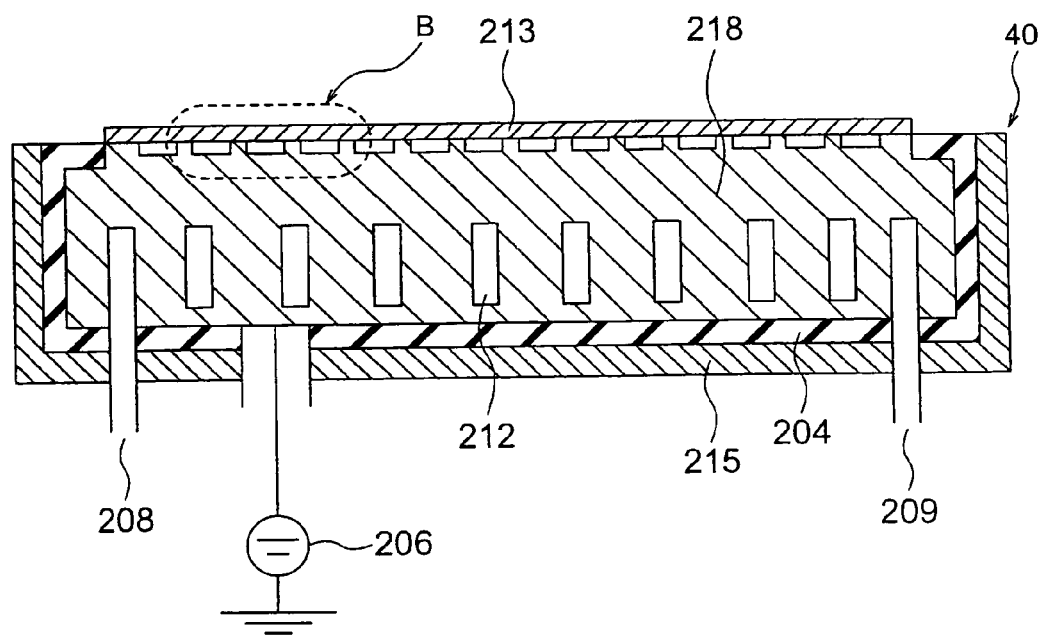
FIG. 18 is a longitudinal sectional view of main parts of an electrostatic chuck device according to a fourth embodiment of the present invention.
Figure 19:
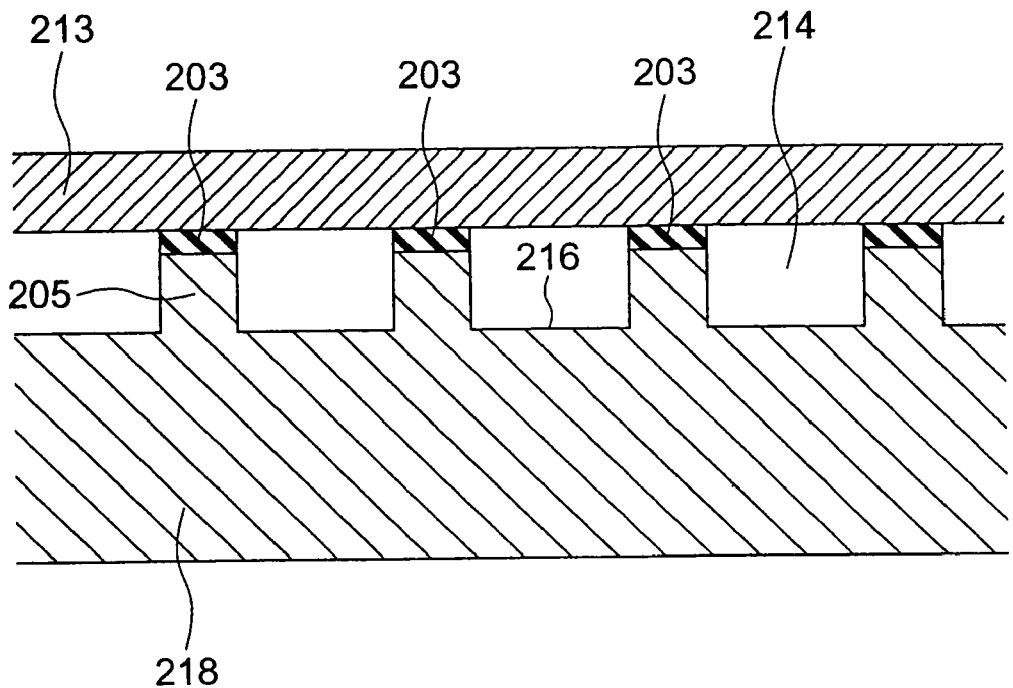
FIG. 19 is an enlarged sectional view of a circle section B shown in FIG. 18.

Next, an electrostatic chuck device according to a fourth embodiment will be explained with reference to FIG. 18 and FIG. 19. In the electrostatic chuck device 40 of the fourth embodiment, a single metal electrode 218 is used. The configuration of the electrostatic chuck device is called a unipolar electrostatic chuck device. A longitudinal sectional view of this electrostatic chuck device is shown in FIG. 18, while an enlarged view of the section B in FIG. 18 is shown in FIG. 19. Except for using the single metal electrode 218, the rest of the configuration in the fourth embodiment is the same as that explained in the third embodiment. Components the same as the components explained in the third embodiment are assigned the same reference numerals.

The top surface of the metal electrode 218 has a plurality of embossed projections 205. The height of these embossed projections 205 is larger than 100 μm. The top parts of the embossed projections 205 are covered by extremely thin dielectric layers 203. The thickness of the dielectric layers 203 are smaller than 1 μm. The thickness of the metal electrode 218 is not important and may be in the range of several mm to several cm. The metal electrode 218 may or may not include a cooling or heating mechanism. In FIG. 18, for example, a cooling mechanism (208, 209, 212) is shown. The metal electrode 218 is insulated by being placed on an insulating block 204 and is connected to a battery 206.

The principle of operation of the fourth embodiment is the same as that explained in the third embodiment. However, to operate the electrostatic chuck device, there must be plasma above the substrate 213. This plasma creates the electrical connection required for passing a DC current through the substrate 213. Therefore, this embodiment can only operate in the presence of plasma. All of the advantages obtained in the third embodiment etc., in particular the ease of release of the substrate and the reduced particles can also be obtained in the fourth embodiment.

Figure 20:
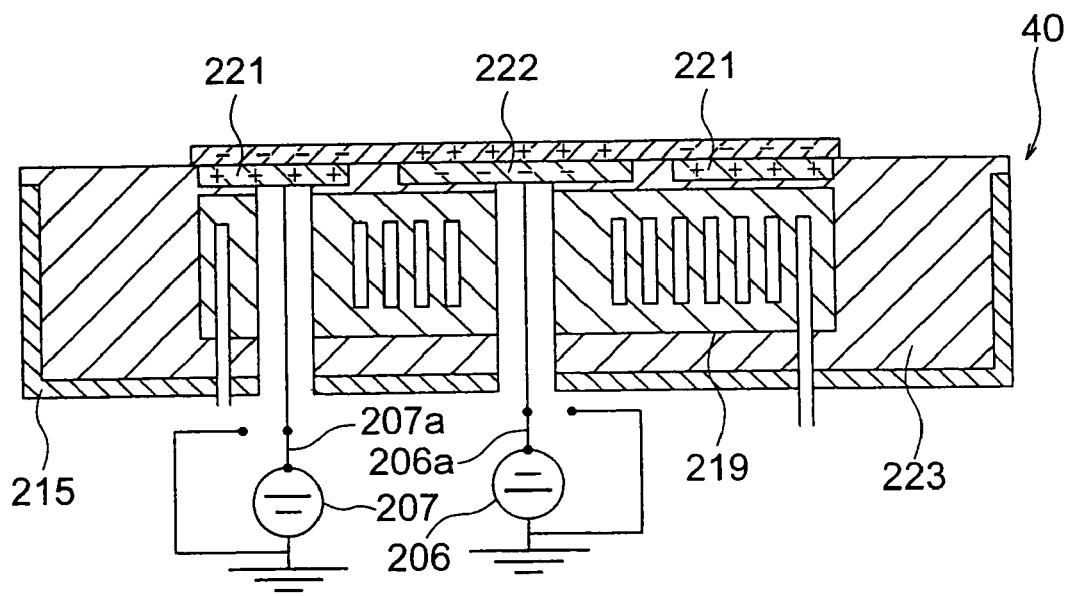
FIG. 20 is a sectional view of main parts of an electrostatic chuck device according to a fifth embodiment of the present invention.

Next, an electrostatic chuck device according to a fifth embodiment will be explained with reference to FIG. 20. The fifth embodiment is comprised as a bipolar electrostatic chuck device 40 having two metal electrodes (221, 222) or a unipolar electrostatic chuck device having just one metal electrode. To facilitate the explanation, this embodiment will be explained by using the configuration of a bipolar electrostatic chuck device. The metal electrodes 221 and 222 are made by thin metal sheets. The thickness of the metal electrodes 221 and 222 are not important and may be in the range of 0.5 mm to 10 mm. These metal electrodes 221, 222 are insulated from each other electrically by the insulating material 223 and are placed on another metal base 219. The metal base 219 is provided with a cooling or heating mechanism for maintaining the metal base 219 at a predetermined temperature. The metal electrodes 221, 222 are connected to the batteries 206, 207 in a separated state by the switches 206A and 207A. Except for this, the rest of the configuration is the same as that explained in the third embodiment.

The operating principle and advantages of the fifth embodiment are the same as those explained in the third embodiment. Here, the only point of difference is that the metal electrodes 221 and 222 themselves do not have cooling or heating mechanisms. Instead, the metal base 219 includes a cooling or heating mechanism. In this way, heat is conducted from the metal electrodes 221 and 222 to the metal base 219 through an insulating material 223.

Figure 21:
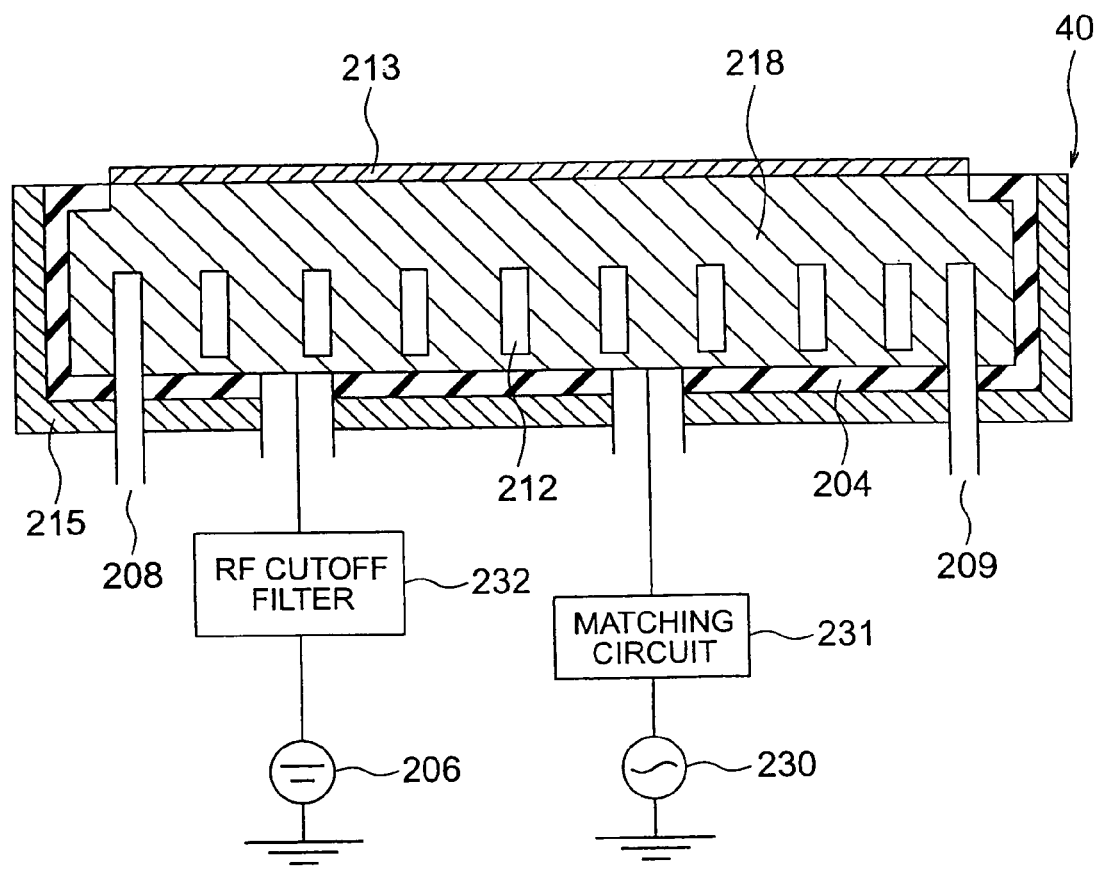
FIG. 21 is a sectional view of main parts of an electrostatic chuck device according to a sixth embodiment of the present invention.

Next, an electrostatic chuck device 50 according to a sixth embodiment will be explained with reference to FIG. 21. This embodiment is an expansion of the above embodiments. FIG. 21 is a longitudinal sectional view of the sixth embodiment. To facilitate the explanation, the configuration explained in the fourth embodiment is used. Therefore, the hardware configuration of the sixth embodiment is substantially the same as that explained in the fourth embodiment. The only difference is that the metal electrode 218 is connected to an rf power source 230 through a matching circuit 231 in addition to the battery 206. In this case, a rf cutoff filter 232 is added to the DC power connection.

The principle of operation of the electrostatic chuck device in the sixth embodiment is the same as that explained in the fourth embodiment. However, here, the metal electrode 218 acts as a rf electrode for generating plasma or an rf electrode for generating self bias voltage by rf bonding with the plasma over the entire surface of the substrate 213. The frequency of the rf current is not important, but is in the range from 100 kHz to 100 MHz.

Figure 22:
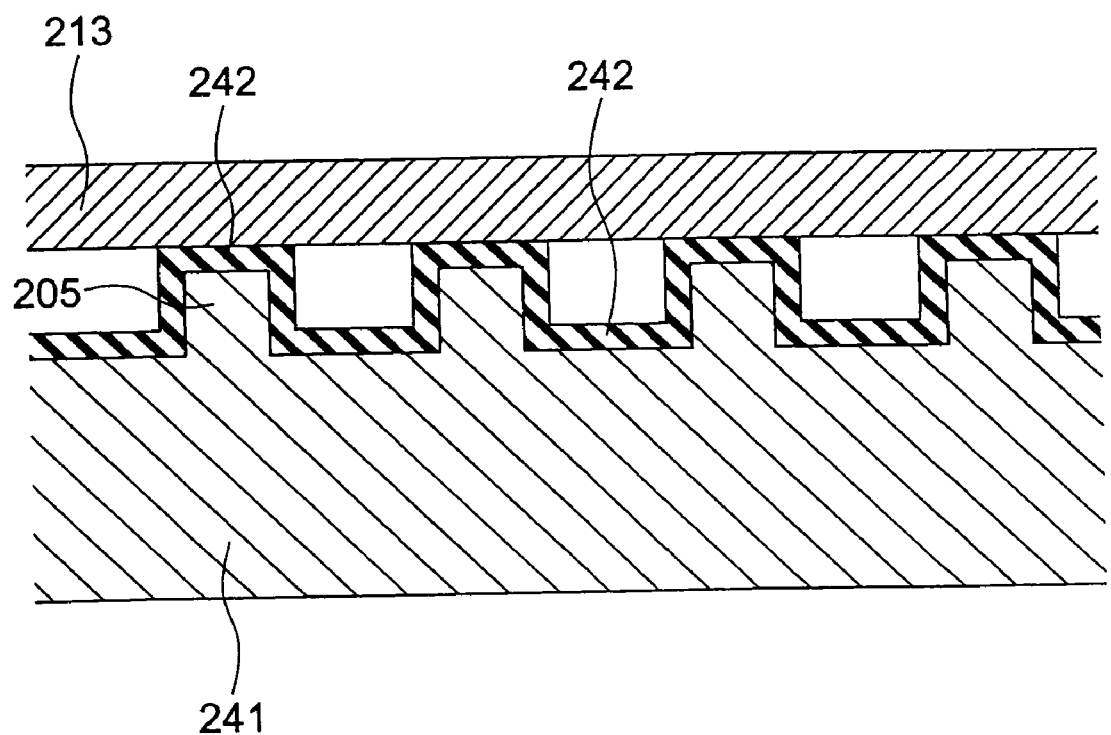
FIG. 22 is an enlarged sectional view of the top surface of a metal electrode used in a seventh embodiment of the present invention.

Next, the electrostatic chuck device 40 according to a seventh embodiment will be explained with reference to FIG. 22. FIG. 22 is a partial sectional view of the seventh embodiment. The configuration of the electrostatic chuck device according to the seventh embodiment is the same as the above embodiments except for the section of the top surface of the electrostatic chuck device.

The structure of the top surface of the metal electrode 241 in the seventh embodiment is shown in FIG. 22. The configuration of the metal electrode 241 is substantially the same as explained in previous embodiments. However, a thin dielectric layer 242 is applied over the entirety of the metal electrode 241. Except for this change, the rest of the configuration is the same as that explained in the above embodiments. In particular, the thickness of the dielectric layer 242 on the top surface of the embossed layer 205 is selected to be that explained in the third embodiment.

The advantages of the seventh embodiment are the same as those explained in the above embodiments. In addition, this configuration withstands a higher voltage applied to the metal electrodes (201, 202, or 218).

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2002-177380 and Japanese Patent Application No. 2002-177381 filed on Jun. 18, 2002, and Japanese Patent Application No. 2002-309915 filed on Oct. 24, 2002, the disclosures of which are expressly incorporated herein by reference in their entirety.

What is claimed is:

1. An electrostatic chuck device comprising:
   a dielectric plate having a surface embossed to have a plurality of projections and depressions,
   an electrode formed in the depressions,
   an external power circuit for switching the electrode to be connected with a battery or a ground terminal, and
   a conductor wiring configured to cover a top surface of all of the projections and electrically connects each of the projections,
   wherein the electrode is divided to have a first electrode and a second electrode which are mutually isolated, a surrounding area of each of the projections in the dielectric plate is formed to have a second depression hollowed along a shape of the projection.

2. An electrostatic chuck device as set forth in claim 1, wherein the conductor wiring comprises a first conductor wiring in a diameter direction and second conductor wirings in a circumference direction, and the second conductor wirings are located as concentric circles.

3. An electrostatic chuck device as set forth in claim 1, wherein the second depression is a round hole and the conductor wiring is not formed on a surface of the round hole.

* * * * *